US 11,486,040 B2

(12) United States Patent
Mosshammer

(10) Patent No.: US 11,486,040 B2
(45) Date of Patent: Nov. 1, 2022

(54) METHOD, NON-VOLATILE MEMORY AND CONTROL DEVICE

(71) Applicant: VON ARDENNE Asset GmbH & Co. KG, Dresden (DE)

(72) Inventor: Steffen Mosshammer, Rabenau (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 835 days.

(21) Appl. No.: 16/251,099

(22) Filed: Jan. 18, 2019

(65) Prior Publication Data
US 2019/0226092 A1 Jul. 25, 2019

(30) Foreign Application Priority Data
Jan. 19, 2018 (DE) .................. 10 2018 101 173.3

(51) Int. Cl.
C23C 16/52 (2006.01)
G06F 9/30 (2018.01)
G06T 17/05 (2011.01)

(52) U.S. Cl.
CPC .......... *C23C 16/52* (2013.01); *G06F 9/30043* (2013.01); *G06T 17/05* (2013.01)

(58) Field of Classification Search
CPC ... C23C 16/52; C23C 16/547; G06F 9/30043; G06T 17/05
(Continued)

(56) References Cited

U.S. PATENT DOCUMENTS 4,627,989 A * 12/1986 Feuerstein ............ H01J 37/302
118/663
2009/0191327 A1 * 7/2009 Lotz ...................... C23C 14/562
427/10
(Continued)

FOREIGN PATENT DOCUMENTS

CN 101925689 A 12/2010
CN 106461373 A 2/2017
(Continued)

OTHER PUBLICATIONS

Chinese First Search Report issued for the corresponding CN application No. 2019100485908, dated Oct. 14, 2020, 1 page (for informational purpose only).
(Continued)

Primary Examiner — Elizabeth A Burkhart
(74) Attorney, Agent, or Firm — Viering, Jentschura & Partner mbB

(57) ABSTRACT

A method comprises: forming a first layer stack on a first substrate by means of a multiplicity of coating processes, each coating process of which forms at least one layer of the first layer stack; detecting an optical spectrum of the first layer stack; determining correction information for at least one coating process of the multiplicity of coating processes using a model, wherein the model provides a right-unique mapping function between a deviation of the spectrum from a desired spectrum and the correction information; and changing at least one control parameter for controlling the at least one coating process of the multiplicity of coating processes using the correction information; and forming a second layer stack on the first or a second substrate by means of the multiplicity of coating processes using the changed control parameter, each coating process of which forms at least one layer of the second layer stack.

17 Claims, 10 Drawing Sheets

(58) Field of Classification Search
USPC ............................................................ 427/10
See application file for complete search history.

(56) References Cited

U.S. PATENT DOCUMENTS

| | | | |
|---|---|---|---|
| 2010/0166945 A1* | 7/2010 | Lee | C23C 16/52 |
| | | | 427/10 |
| 2015/0262383 A1 | 9/2015 | Yajko | |
| 2016/0362780 A1 | 12/2016 | Van De Putte et al. | |
| 2020/0181763 A1* | 6/2020 | Waldner | G01B 11/0683 |

FOREIGN PATENT DOCUMENTS

| | | |
|---|---|---|
| DE | 10 2014 118 878 A1 | 6/2016 |
| WO | 2014 105 557 A1 | 7/2014 |
| WO | 2016 110 407 A1 | 7/2016 |

OTHER PUBLICATIONS

German Office Action based on Application No. 10 2018 101 173.3 (5 pages) dated Oct. 11, 2018 (for reference purpose only).
C. Deus et al.; "Strategies for In-Situ Evaluation of Optical Layer Stacks in Large-Area In-Line Production Systems"; 49th Annual Technical Conference Proceedings; 2006; pp. 223-228.
W. Theiss et al.; "Serial, Parallel and Serious—Optical Production Control for Thin Film Deposition Systems"; 57th Annual Technical Conference Proceedings, Chicago; May 3-8, 2014; pp. 1-4.

\* cited by examiner

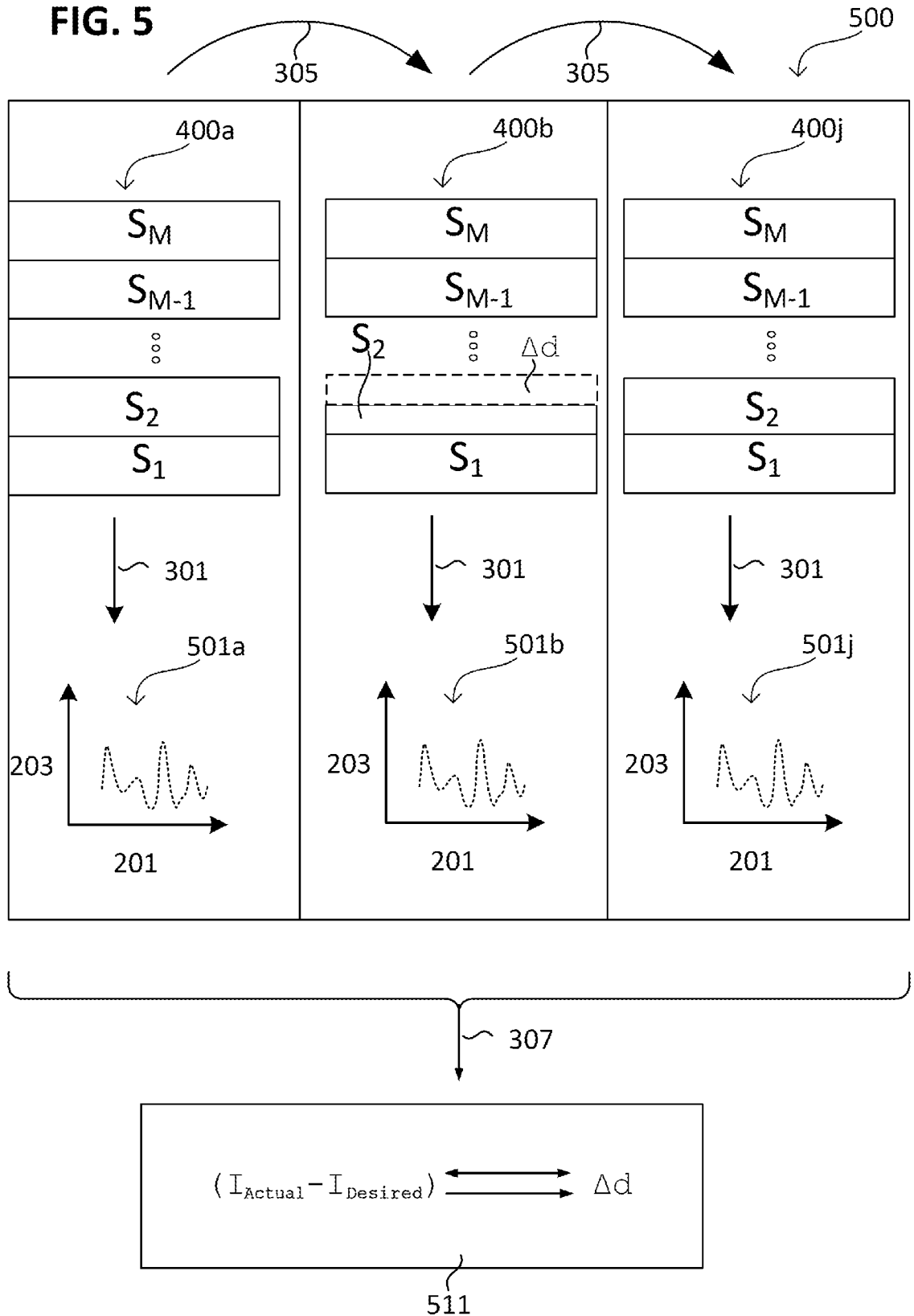

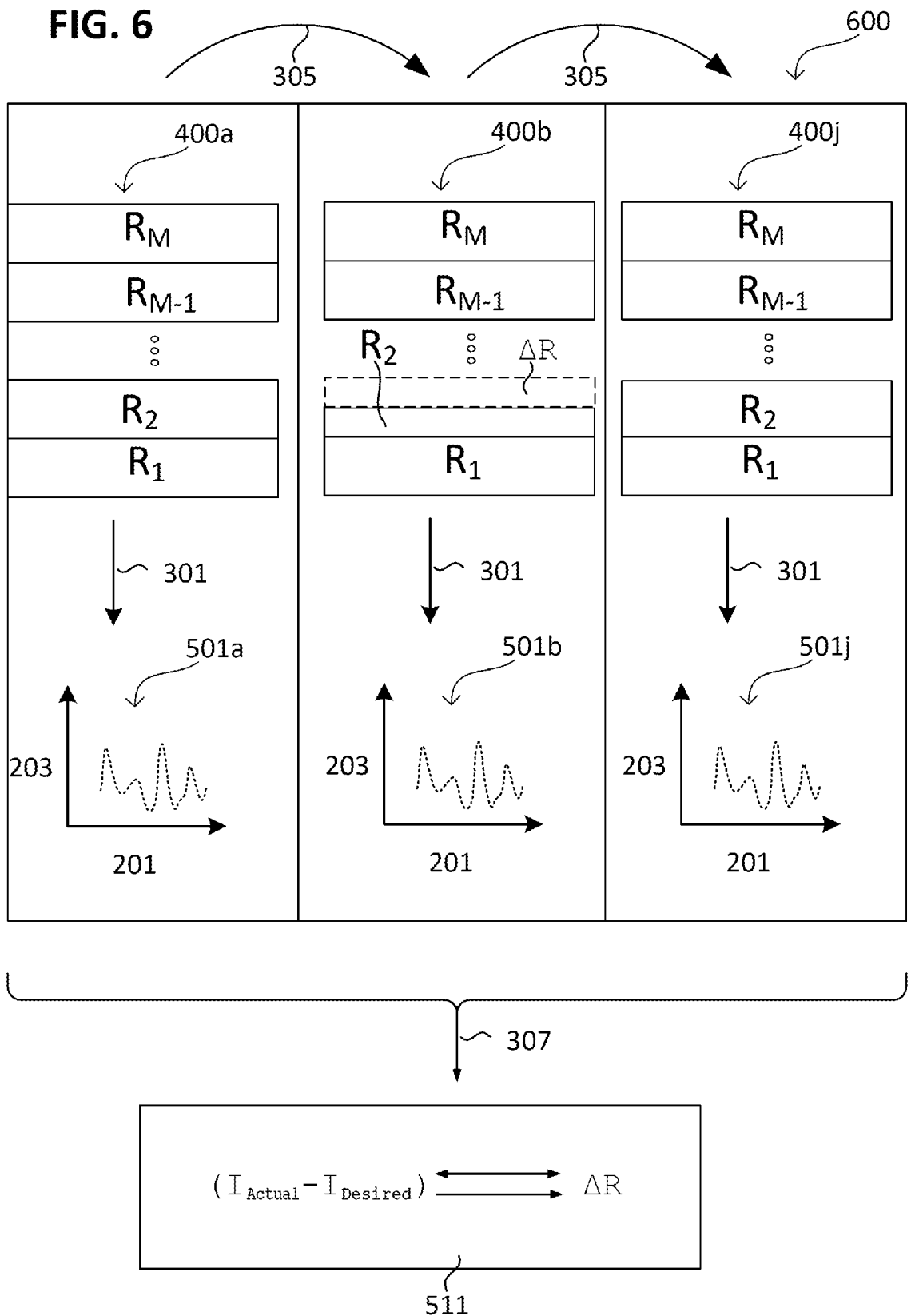

METHOD, NON-VOLATILE MEMORY AND CONTROL DEVICE

CROSS-REFERENCE TO RELATED APPLICATION

This application claims priority to German application 10 2018 101 173.3, which was filed on 19 Jan. 2018, the entire contents of which are hereby incorporated herein in their entirety.

TECHNICAL FIELD

The invention relates to a method, a non-volatile memory and a control device.

DESCRIPTION

In general, the optical properties of a transparent carrier, such as e.g. a glass pane, a film or the like, may be changed by means of a coating. It is conventional practice to equip sheets of window glass, for example, with a coating which is intended to reflect the infrared light as much as possible and in this case is intended at the same time to have a certain aesthetic appeal or optical transparency. The balance between transparency and reflection properties of a, for example coated, glass pane gives rise to complex parameter relationships, particularly if a layer system having a plurality of layers arranged one above another is used. Besides the optical material properties, the angle dependencies of the optical properties and of the dispersion relations should also be taken into account. Therefore, a multiplicity of layer systems adapted to their specific purpose of use have already been developed.

Increasing requirements in respect of reducing costs, e.g. by simplifying the production method, faster availability and more expedient materials, and requirements in respect of quality assurance, chemical and also mechanical robustness and optical performance of the layer systems may often only be satisfied in part by conventional layer systems. In particular, given high optical performance, it is necessary to accept higher costs on account of the higher outlay for quality assurance.

In a conventional production chain, on the basis of the optical properties sought, a series of simulations is carried out in order to find a layer system that comes as close as possible to the optical properties sought (also referred to as layer planning). Said simulations are based on a model which parameterizes the properties of the individual layers and calculates the optical properties of the entire layer system on the basis thereof. The parameters of the model, such as the chemical composition of the layers, the number thereof, the refractive index thereof, the order thereof, the thickness thereof, etc., are subsequently varied until the calculated optical properties and the optical properties sought clearly coincide as much as possible. As a result, the parameters of the individual layers to be produced, such as the chemical composition thereof, the refractive index thereof and the thickness thereof, are obtained, which are stored as a desired layer system. There exists theoretically, however, a high diversity of layer systems which matches the optical properties sought, which is manageable only with difficulty and is difficult to determine in its entirety. Therefore, the layer planning may lead to a high number of suitable layer systems, from which the most expedient is selected.

During the production of the calculated layer system, the coating installation is configured in accordance with the desired layer system to be produced. For quality assurance purposes, optical measurements of the layer system produced are carried out and the actual optical properties are compared with the optical properties sought. If these deviate from one another too much, the coating installation has to be adapted.

For this purpose, analogously to layer planning, the parameters of the model are varied by means of a compensation calculation until the calculated optical properties and the measured optical properties clearly coincide as much as possible. As a result, the actual parameters of the individual layers, such as, for example, the thickness thereof, are obtained, which are stored as an actual layer system. From the comparison of the actual layer system with the desired layer system it is possible to draw conclusions therefrom as to how the coating installation should be adapted.

In this respect see for example DE 10 2014 878 A1, WO 2014 105 557 A1, WO 2016 110 407 A1, Deus et al. ("Strategies for In-Situ Evaluation of Optical Layer Stacks in Large-Area In-Line Production Systems", 49th Annual Technical Conference Proceedings, 2006, ISSN 0737-5921) or Theiss et al. ("Serial, Parallel and Serious—Optical Production Control for Thin Film Deposition Systems", 57th Annual Technical Conference Proceedings, Chicago, Ill. May 3-8, 2014, ISSN 0737-5921).

However, the complexity of this procedure rises considerably with the number of layers of the layer system, such that already more than five layers result in an almost insurmountable computational complexity and a high risk of the calculated actual layer system not matching the layer system actually produced, i.e. of the simulation going wrong. This stems, inter alia, from the above circumstance that there exists theoretically, a high diversity of layer systems which matches the optical properties measured, which is manageable only with difficulty and is difficult to determine in its entirety. Therefore, for the compensation calculation, there is also a high diversity of convergence scenarios and, depending on boundary conditions chosen, associated parameter sets toward which the compensation calculation may converge.

Therefore, it is conventional practice to carry out a multiplicity of measurements which capture the layer system to be produced at different stages of the production process, e.g. of all four layers, such that there is an increase in the number of available pieces of information and boundary conditions deducible therefrom, such that the parameter sets of the different stages of the layer system may influence one another. Illustratively, the parameter set of an early production stage is used as a boundary condition for a compensation calculation at a later production stage. The parameters of the layer system produced are thus deduced step by step.

Although this procedure reduces the risk of the simulation going wrong, it shifts the complexity from the calculation side to the measurement side, such that the complexity associated therewith nevertheless results in high costs. On account of the complex calculation, it is likewise not readily possible to implement an automated closed-loop control for the coating installation since the result of the compensation calculation cannot be trusted. Therefore, quality assurance may be carried out only with extensive knowledge and many years of experience and has to be constantly manually recalibrated and/or checked.

In accordance with various embodiments, illustratively it has been recognized that a smaller number of pieces of information than supplied by the compensation calculation is sufficient for adapting the coating installation. Accordingly, the complexity for determining the actual layer system may be reduced by dispensing with obtaining an actual layer system defined to its full extent. The number of parameters to be obtained is reduced, which in turn provides more information for each of the parameters.

Illustratively, it has been recognized that, proceeding from an operating point about which it is known that the coating installation produces the layer stack with the properties sought, the open-loop control and/or closed-loop control thereof may be simplified for the coating installation. Said operating point is used as a starting point, i.e. as a boundary condition, for reducing the complexity. Illustratively, the closed-loop control does not attempt to determine all parameters of the individual layers of the layer stack, but rather only the adaptation of the operating point that is to be performed, in order to revert to the known operating point.

In that context it has been recognized that, proceeding from the known operating point, the changes in the optical properties of the layer system produced may be uniquely mapped onto a change to be made to the operating point, e.g. by means of the choice of a model. Therefore, the production process and quality assurance for the latter are simplified by the implementation of a closed-loop control. By way of example, a plurality of models may exist which provide a right-unique mapping to the target set of the change to be made to the operating point, and from which e.g. a model may be selected.

In accordance with various embodiments, a method for coating may comprise: forming a first layer stack on a first substrate by means of a multiplicity of coating processes, each coating process of which forms at least one layer of the first layer stack; detecting an optical spectrum of the first layer stack; determining correction information for at least one coating process of the multiplicity of coating processes using a model, wherein the model provides a right-unique mapping function (e.g. a functional relationship) between a deviation of the spectrum from a desired spectrum and the correction information; and changing at least one control parameter for controlling the at least one coating process of the multiplicity of coating processes using the correction information; and forming a second layer stack on the first or a second substrate by means of the multiplicity of coating processes using the changed control parameter, each coating process of which forms at least one layer of the second layer stack.

In the figures

Figure 7A:
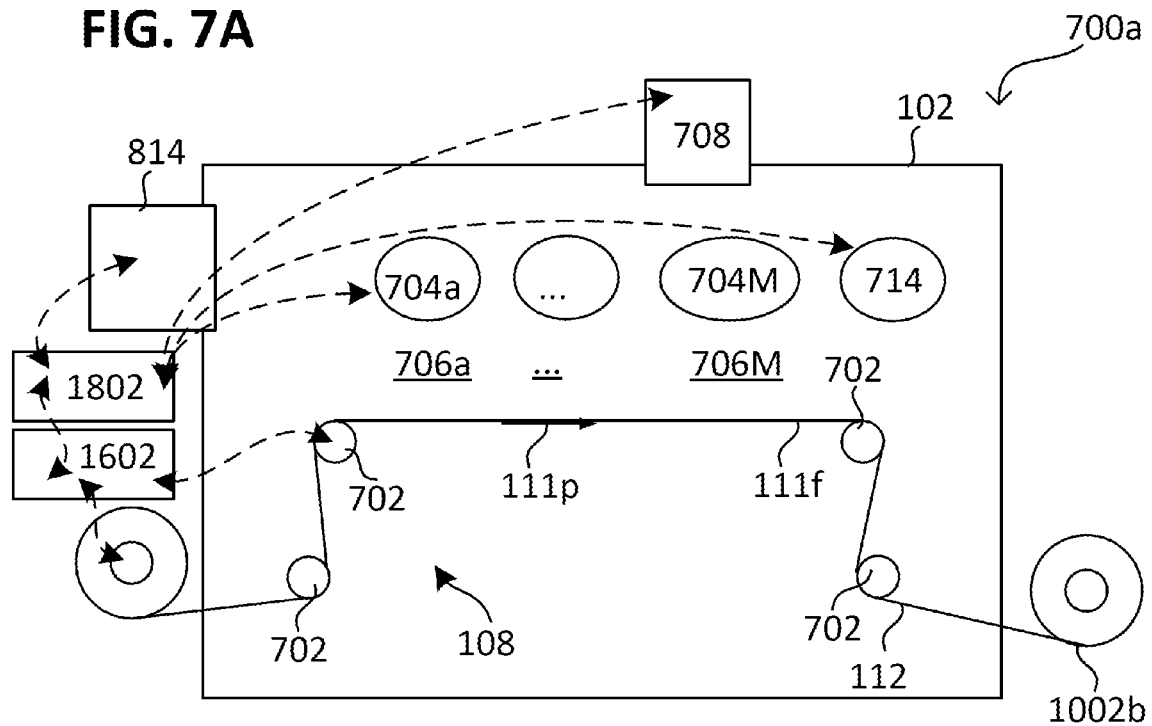
Figure 7B:
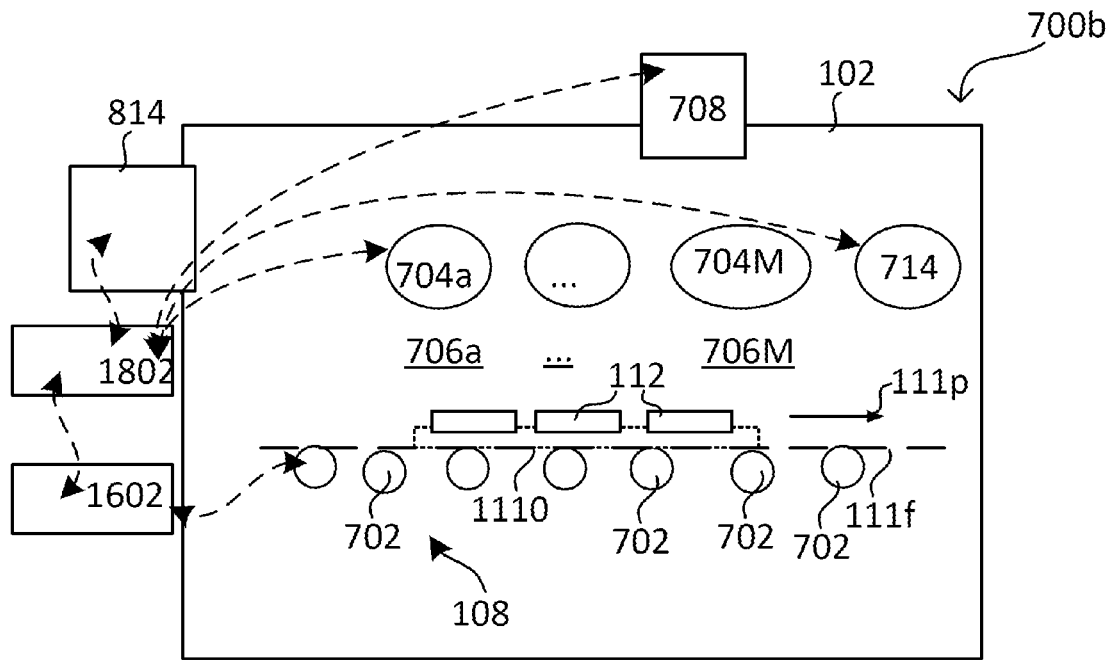
Figure 8:
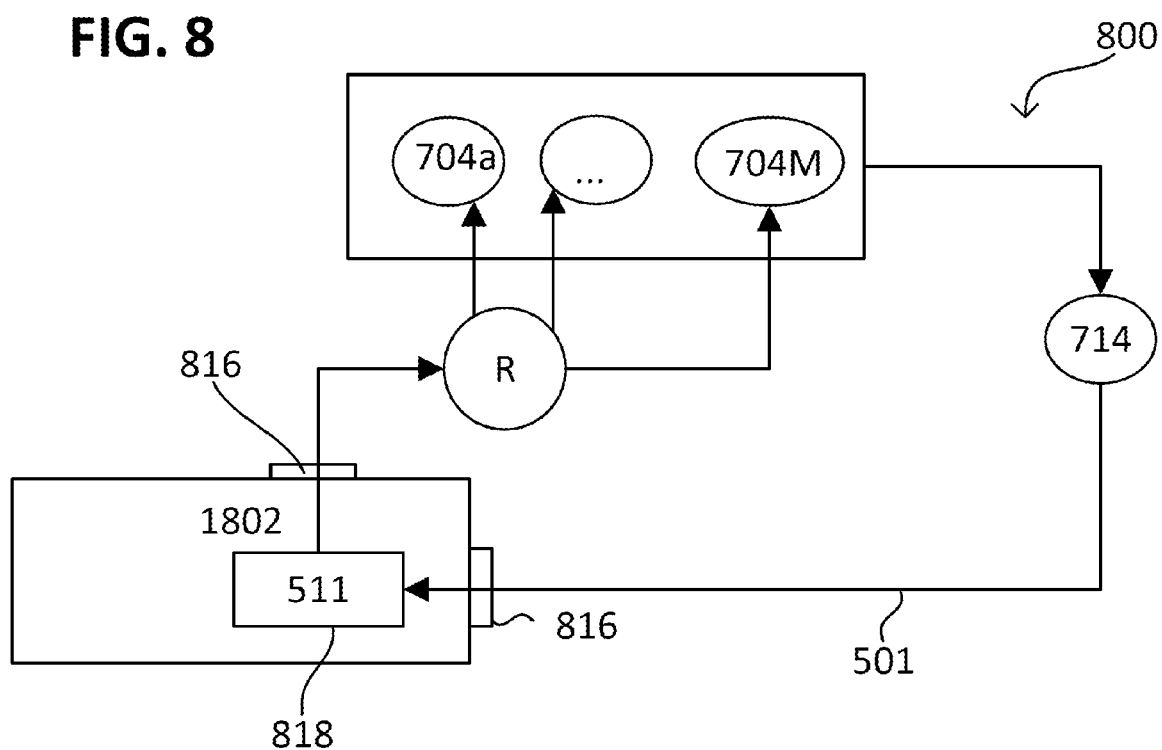
Figure 9:
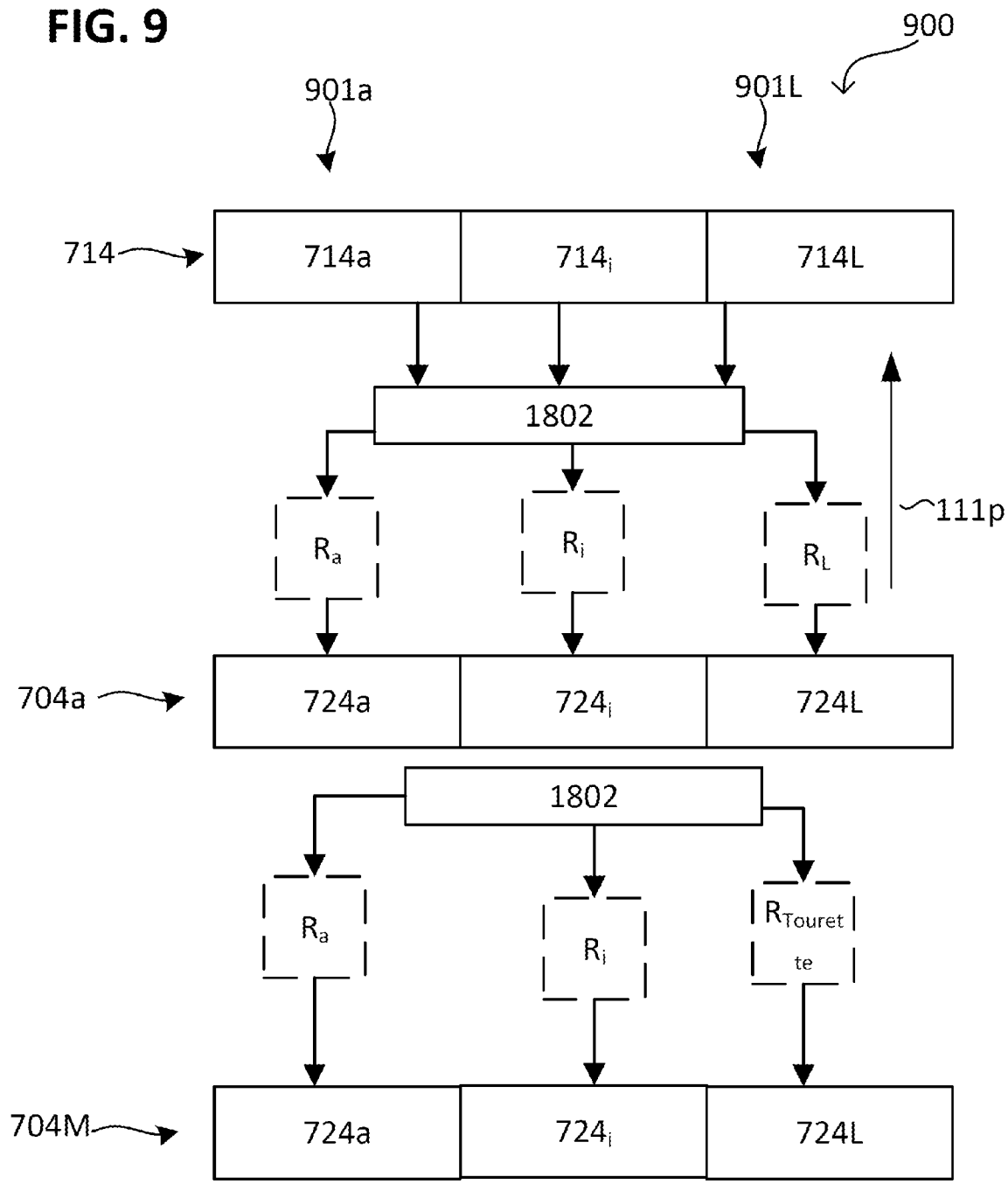
Figure 10:
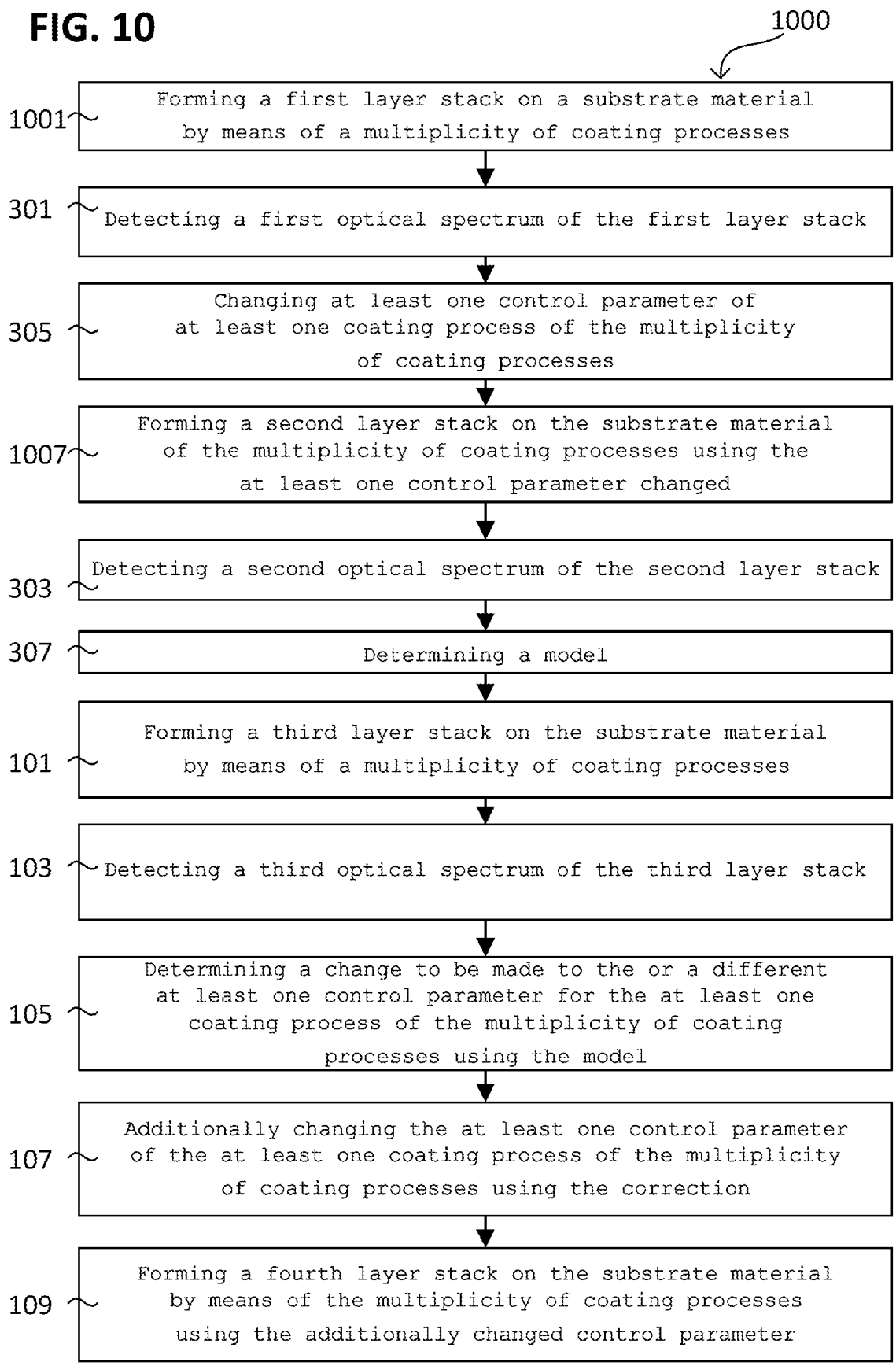

FIGS. 5 and 6 in each case show the method in a schematic flow diagram in accordance with various embodiments;

FIGS. 7A and 7B in each case show a coating installation in the method in a schematic side view or cross-sectional view in accordance with various embodiments;

FIG. 8 shows the method in a schematic flow diagram in accordance with various embodiments;

FIG. 9 shows the method in a schematic plan view in accordance with various embodiments; and FIG. 10 shows a method for coating substrate material in accordance with various embodiments in a schematic flow diagram.

In the following detailed description, reference is made to the accompanying drawings, which form part of this description and show for illustration purposes specific embodiments in which the invention may be implemented. In this regard, direction terminology such as, for instance "at the top", "at the bottom", "at the front", "at the back", "front", "rear", etc. is used with respect to the orientation of the figure(s) described. Since component parts of embodiments may be positioned in a number of different orientations, the direction terminology serves for illustration and is not restrictive in any way whatsoever. It goes without saying that other embodiments may be used and structural or logical changes may be made, without departing from the scope of protection of the present invention. It goes without saying that the features of the various exemplary embodiments described herein may be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection (e.g. resistive and/or electrically conductive, e.g. an electrically conductive connection) and a direct or indirect coupling. In the figures, identical or similar elements are provided with identical reference signs, in so far as this is expedient.

In accordance with various embodiments, a quantity may be understood to mean a physical quantity (e.g. a radiation power) which represents (e.g. describes and/or correlates with) a quantitatively detectable property of a physical entity (e.g. of an object, of a process or of a state). Its value (quantity value) may optionally be dependent on time t and/or location P, for example the composition of reflected and/or transmitted electromagnetic radiation. Optionally, the physical quantity, e.g. an electric field, may have an anisotropy with respect to the physical space and/or over time, that is to say that the quantity value is dependent on the measurement direction and/or measurement order. By way of example, a signal strength may generally represent an electrical quantity of a signal (e.g. of a measurement signal), e.g. the current, voltage, amplitude, power, DC value, peak value, etc. of said signal.

In general, different (physical) quantities may be used to represent the same property of a physical entity (e.g. of an object, process or state). The different physical quantities may be linked (e.g. right-uniquely and/or left-uniquely) with one another (e.g. by means of only invariant quantity or quantities and/or quantity or quantities attributed inherently to the entity), such that they may be converted into one another taking account of the linkage (e.g. a function or dependence among one another). In this regard, by way of example, momentum and kinetic energy are a function of mass and velocity, i.e. are linked together by means of mass and velocity, and given knowledge of mass, for example, may both represent velocity and/or one another. In other words, the (physical) quantities linked together may be converted into one another, that is to say that they also represent one another. The quantities representing one another may have for example the same type, e.g. kinetic, mechanical, geometric, thermodynamic, electrical, magnetic, radiometric (e.g. photometric, e.g. optical), etc.

In accordance with various embodiments, open-loop control may be understood as intentionally influencing a system.

In this case, the state of the system may be changed in accordance with a predefinition. Closed-loop control may be understood as open-loop control with a state change of the system as a result of disturbances additionally being counteracted. Illustratively, the open-loop control may have a feedforward controlled system and thus illustratively implement a sequence control that converts an input quantity into an output quantity. However, the controlled system may also be part of a closed-loop control circuit, such that a closed-loop control is implemented. In contrast to pure feedforward control, the closed-loop control exhibits a continuous influencing of the input quantity by the output quantity, which is brought about by the closed-loop control circuit (feedback). In other words, a closed-loop control may be used as an alternative or in addition to the open-loop control, or closed-loop control may be carried out as an alternative or in addition to open-loop control. In the case of a closed-loop control, an actual value of the controlled quantity (e.g. determined on the basis of a measurement value) is compared with a reference value (a setpoint value or a predefinition or a predefined value). On the basis of this, the controlled quantity may be influenced by means of a manipulated quantity (using an actuator) in such a way as to result as far as possible in a small deviation of the respective actual value of the controlled quantity from the reference value.

In accordance with various embodiments, it becomes possible to equip a coating installation (e.g. a glass coating installation referred to as: "glass coater") with an open-loop control and/or closed-loop control (e.g. implemented by software) which makes it possible partly or fully automatically to create layer systems, to put them into operation and to keep them stable during operation.

In accordance with various embodiments, at least one of the following may be provided and/or facilitated:
  setting up (e.g. calibrating) the coating installation and/or starting up (starting) the coating installation;
  automatically conditioning (e.g. calibrating) the coating installation;
  tracking the operating point (e.g. the process parameters) of the coating installation, e.g. in order to keep the optical properties of the layer system as constant as possible, e.g. in order to obtain constant product properties in the layer system during production;
  tracking the operating point of the coating installation, e.g. to come as close as possible to the optical properties sought, e.g. in order to obtain minimized colour value deviations in the layer system during production;
  rapidly setting up (e.g. calibrating) the coating installation for producing a known layer system (e.g. proceeding from layer thickness mean values);
  rapidly setting up the coating installation for producing a new layer system (e.g. by way of layer thickness mean values).

By way of example, tracking the operating point may be considerably simplified by means of an automated closed-loop control, as will be described in even greater detail later.

In accordance with various embodiments, the open-loop control and/or closed-loop control provided may be used for stabilizing the optical product properties (colour, transmission, reflection), e.g. by stabilizing the layer thicknesses at the central point. By way of example, the product properties sought may be set once and be stabilized and/or obtained by means of the open-loop control and/or closed-loop control.

In accordance with various embodiments, a or each substrate (e.g. of a substrate material) may comprise or be formed from a film and/or a glass plate. By way of example, an (e.g. flexible) low-emission laminate may comprise the following: two transparent films; and a layer system in accordance with various embodiments between the two films. By way of example, a rigid or flexible carrier (e.g. comprising glass or metal and/or in the form of a plate, film, a strip, e.g. a metal strip, and/or a wafer) may be used as substrate and be coated by means of the vacuum-aided coating with the layer stack (e.g. a low-emission multilayer system).

In accordance with various embodiments, the layer stack may comprise or be formed from an optical low-emission multilayer system. The low-emission multilayer system may comprise: a dielectric base layer arrangement (e.g. comprising one or more layers) and a dielectric cover layer arrangement (e.g. comprising one or more layers); a functional layer arrangement (e.g. comprising one or more layers) comprising a metallic functional layer and arranged between the base layer arrangement and the cover layer arrangement, wherein the cover layer arrangement optionally comprises at least one protective layer. The protective layer may comprise for example a semimetal (e.g. silicon) and/or a non-metal (e.g. nitrogen), a nitride thereof and/or an oxide thereof.

In accordance with various embodiments, a layer stack having a transmission coefficient (also referred to as transmittance) for light ($T_{vis}$) of greater than approximately 70% is provided, e.g. for a window (e.g. windscreen) of an automobile. The provided transmittance of more than 70% for the low-emission multilayer system may be related for example to a specific wavelength range (also referred to as passband) of the electromagnetic radiation, e.g. to that of visible light (i.e. a wavelength range of approximately 380 nm to approximately 780 nm) or to a limiting wavelength or to 550 nm.

Optionally, the layer stack and/or the substrate may be transparent. In the context of this description, the term "transparent" (e.g. light-transmissive) may be understood to mean that a structure (e.g. a substrate or a layer) or a material has a transmittance such that a large portion of the electromagnetic radiation (e.g. light) impinging thereon passes through it, e.g. more than is absorbed and/or reflected by it. A light-transmissive structure or material may be formed as e.g. translucent (e.g. partly light-transmissive). In other words, the transmittance within the passband may be greater than (e.g. at least double, three times, five times or ten times the magnitude of) the reflectance and/or the absorbance (e.g. the sum thereof).

The transmission coefficient (also referred to as transmittance) may denote that proportion of the electromagnetic radiation (e.g. of the visible light) which passes through the structure (e.g. the layer system) or the material. The reflectance (also referred to as reflection coefficient) may denote that proportion of the incident electromagnetic radiation which is reflected (e.g. reemitted) by the structure or the material. The reflectance may take account of directionally reflected radiation (illustratively reflected back), diffusively reflected radiation and/or reemitted radiation. The absorptance (also referred to as absorption coefficient) may denote that proportion of the incident electromagnetic radiation which is absorbed (i.e. taken up and/or swallowed) by the structure or the material, e.g. by being converted into heat.

A transparent structure or a transparent material may have a transmittance (transmission coefficient) which is greater than approximately 50%, e.g. greater than approximately 60%, e.g. greater than approximately 70%, e.g. greater than approximately 80%, e.g. greater than approximately 90%. By way of example, the transmittance may be in a range of approximately 70% and approximately 99%.

Depending on the field of use of a coating (e.g. comprising one or more than one layer stack), the transmittance (T), the absorptance (A), the reflectance (R) and/or the emissivity thereof may be adapted, such that e.g. visible light is transmitted and/or infrared radiation (IR radiation) is reflected and/or hardly emitted. In other words, the coating may be configured as an optical filter or an optical reflector. At thermal equilibrium (that is to say that the spatial and/or temporal temperature difference ΔT substantially vanishes), the absorption and the emission of electromagnetic radiation may at least partly (e.g. substantially) cancel one another out, with the result that the technical design of the coating may be simplified by optimizing the parameters under consideration to the transmittance (filter) and the reflectance (reflector). In other words, a body at thermal equilibrium absorbs and emits radiation. In this case, the radiation (i.e. emission) of long-wave (e.g. in the infrared spectral range) thermal radiation (more generally the emitted radiation) given T=0 (or transmittance at least substantially equal to zero) for a glazing (glass is e.g. non-transparent in the IR) may be proportional to the absorption (A=1−R). By contrast, a low-emission multilayer system (e.g. an IRR coating) provided herein may bring about a high reflectance (R) in the IR spectral range (infrared spectral range), which in turn means a low absorptance and hence a low emission (low-E).

In general, the transmittance in accordance with the optical properties of the structure or of the material may be dependent on the wavelength of the electromagnetic radiation. By way of example, the structure or the material may be transparent to one or more wavelength ranges, while it is non-transparent (also referred to as opaque) to one or more additional wavelength ranges, i.e. filters the latter out. The one or more wavelength ranges filtered out may be absorbed and/or reflected. A further aspect of the optical properties of the structure or of the material is the emissivity, which describes how much electromagnetic radiation is released (emitted) in comparison with an ideal thermal radiator, i.e. a black body, at the same temperature.

In accordance with various embodiments, a dielectric material or a dielectric structure (e.g. layer) may be understood as electrically insulating, e.g. having an electrical conductivity of less than $10^{-6}$ siemens/metre. The dielectric material or the dielectric structure may comprise or be formed from, for example, an oxidic and/or nitridic ceramic (e.g. as compound of a metal). Oxidic may be understood to mean that the material or the structure comprises or may be formed from an oxygen compound (e.g. a metal oxide). Nitridic may be understood to mean that the material or the structure comprises or may be formed from a nitrogen compound (e.g. a metal nitride). The dielectric material or the dielectric structure may be transparent.

In the context of this description, a metal (also referred to as metallic material) may comprise (or be formed from) at least one metallic element (i.e. one or more metallic elements), e.g. at least one element from the following group of elements: copper (Cu), iron (Fe), titanium (Ti), nickel (Ni), silver (Ag), chromium (Cr), platinum (Pt), gold (Au), magnesium (Mg), aluminium (Al), zirconium (Zr), tantalum (Ta), molybdenum (Mo), tungsten (W), vanadium (V), barium (Ba), indium (In), calcium (Ca), hafnium (Hf) and/or samarium (Sm).

In accordance with various embodiments, a vacuum-aided coating (e.g. forming the individual layers of the layer stack) may be provided with the aid of an electrical discharge (also referred to as plasma). For this purpose, a plasma-forming (e.g. inert) gas may be ionized by means of a cathode, wherein a material to be deposited (also referred to as target) of the cathode may be sputtered (also referred to as sputtering) by means of the plasma formed in the process. The sputtered material may then be brought to a substrate, on which it may deposit and form a layer (also referred to as coating). Modifications of cathode sputtering are sputtering by means of a magnetron, so-called magnetron sputtering, e.g. reactive magnetron sputtering or non-reactive magnetron sputtering. In this case, forming the plasma may be assisted by means of a magnetic field that may influence the ionization rate of the plasma-forming gas. The magnetic field may be generated by means of a magnetic system, wherein a plasma channel in which the plasma may form may be formed by means of the magnetic field. For the purpose of sputtering, the coating material as a solid (also referred to as a target) may be arranged between the plasma channel and the magnetic system, such that the target may be permeated by the magnetic field and the plasma channel may form on the target. The plasma-forming gas (e.g. argon) together with an optional reactive gas may form a process gas in which sputtering takes place. Reactive magnetron sputtering may be carried out by means of the reactive gas.

A right-unique (also referred to as functional or single-valued) mapping function which maps from a domain of definition to a target set (e.g. codomain) may be understood to mean that each element of the domain of definition (also referred to as preimage, e.g. an x-value) is assigned exactly one element of a target set (also referred to as image, e.g. a y-value). In other words, the right-unique mapping function may map the elements of the domain of definition A uniquely onto the elements of a target set B. Illustratively, no element of the domain of definition (i.e. of the set to be mapped or of the "left-hand side") may have more than one allocated partner of the target set (of the "right-hand side"). In other words, each function value is assumed exactly once. This should be differentiated from left-uniqueness (also referred to as injectivity), in which no element on the right-hand side has more than one partner on the left-hand side.

Figure 1:
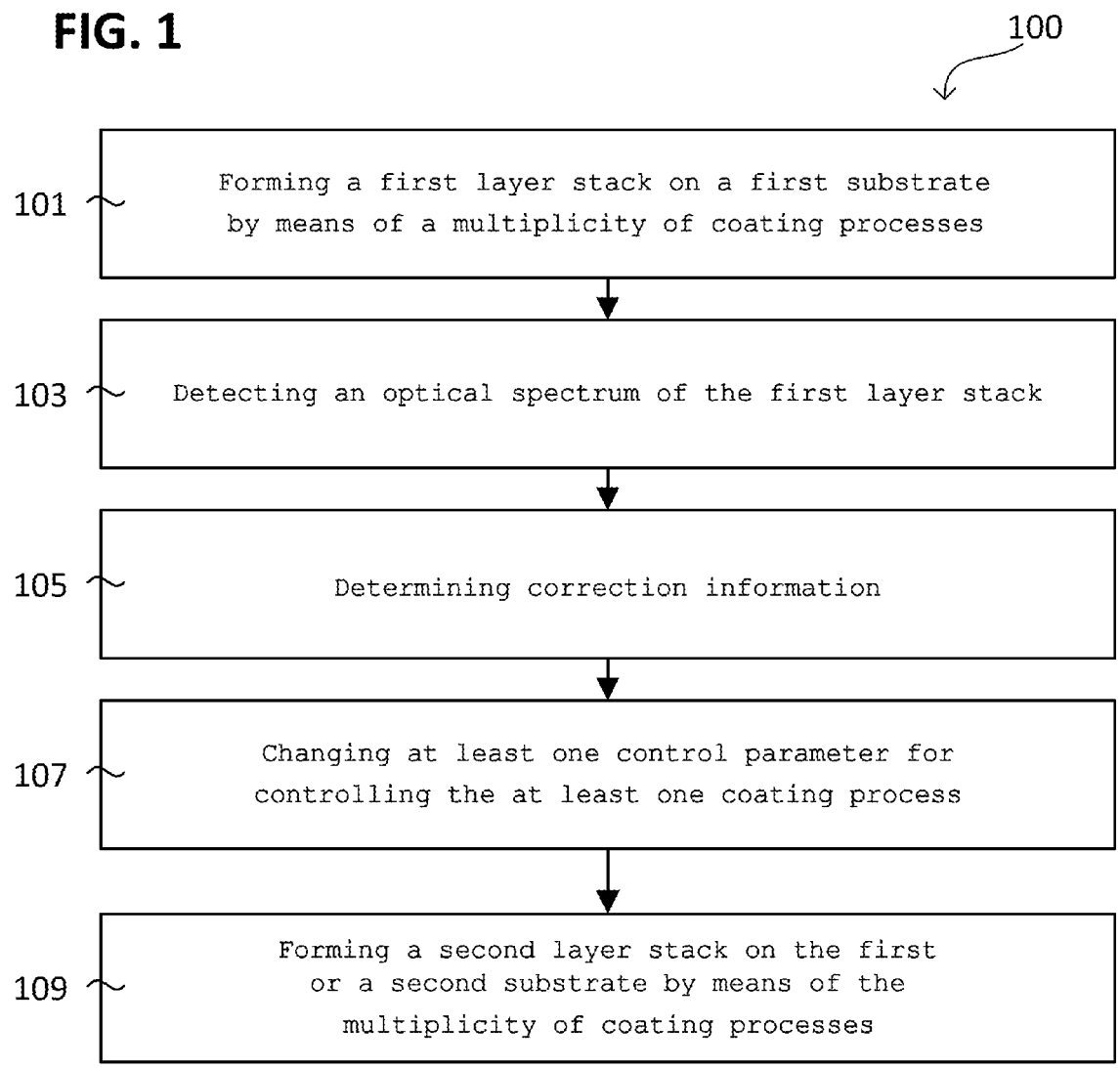
FIG. 1 shows a method in accordance with various embodiments in a schematic flow diagram.

FIG. 1 illustrates a method 100 in accordance with various embodiments in a schematic flow diagram.

The method 100 may comprise: in 101 forming a first layer stack on a first substrate by means of a multiplicity of coating processes, in 103 detecting an optical spectrum of the first layer stack (also referred to as spectrum detecting 103), in 105 determining correction information, in 107 changing at least one (i.e. exactly one or more than one, e.g. each) control parameter for controlling the at least one coating process (e.g. for each coating process of the multiplicity of coating processes), and in 109 forming a second layer stack on the first or a second substrate by means of the multiplicity of coating processes using the changed control parameter.

Each coating process of the coating processes may form at least one layer of the first layer stack and/or of the second layer stack.

Determining 105 the correction information may be carried out for at least one (i.e. exactly one or more than one, e.g. each) coating process of the multiplicity of coating processes. In other words, the at least one coating process may comprise exactly one or more than one coating process of the multiplicity of coating processes, e.g. each coating process of the multiplicity of coating processes.

Determining 105 the correction information may be carried out using a model. The model may provide a mapping function (e.g. a functional relationship) between a deviation of the measured spectrum from a predefined desired spectrum and the correction information. The deviation of two spectra from one another, e.g. of the measured spectrum from the desired spectrum, may also be referred to as spectral deviation. By way of example, the desired spectrum may be stored in the form of data in a memory.

Changing 107 may be carried out using the correction information. Forming 109 the second layer stack may be carried out using the changed control parameter.

Illustratively, the multiplicity of coating processes may be characterized on the basis of the first layer stack and the coating may be corrected in order to correspond to a desired characteristic and the second stack layer may be formed by means of the corrected multiplicity of coating processes.

The first layer stack and the second layer stack may be formed for example on the same substrate, e.g. temporally successively. By way of example, the first layer stack and the second layer stack may be part of a continuous coating of the substrate. By way of example, changing the at least one control parameter may be carried out while the first substrate (e.g. a long plate or a strip shaped substrate) is being coated, e.g. without interrupting the coating.

Alternatively, the first layer stack and the second layer stack may be formed on different substrates, e.g. temporally successively. Optionally, at least one additional substrate may be coated between the first and second substrates, e.g. by means of the multiplicity of coating processes. By way of example, the first layer stack and the second layer stack may be separated from one another (e.g. temporally and/or spatially). Alternatively or additionally, changing the at least one control parameter may be carried out while a continuous stream of substrates (e.g. as substrate material) is being coated by means of the multiplicity of coating processes, e.g. without interrupting the coating.

The at least one (i.e. one or more than one) control parameter may generally be a parameter which defines the operating point of the at least one coating process. By way of example, the operating point of the or each coating process may be defined by a plurality of control parameters. By way of example, the at least one control parameter may comprise at least one of the following parameters: a transport speed (of the substrate), a coating rate, a gas flow rate, an electrical voltage, an electrical current, an electrical power, a temperature, a chemical gas composition, a spatial distribution of gas fed to the coating process, a process pressure, a gas partial pressure.

Figure 2:
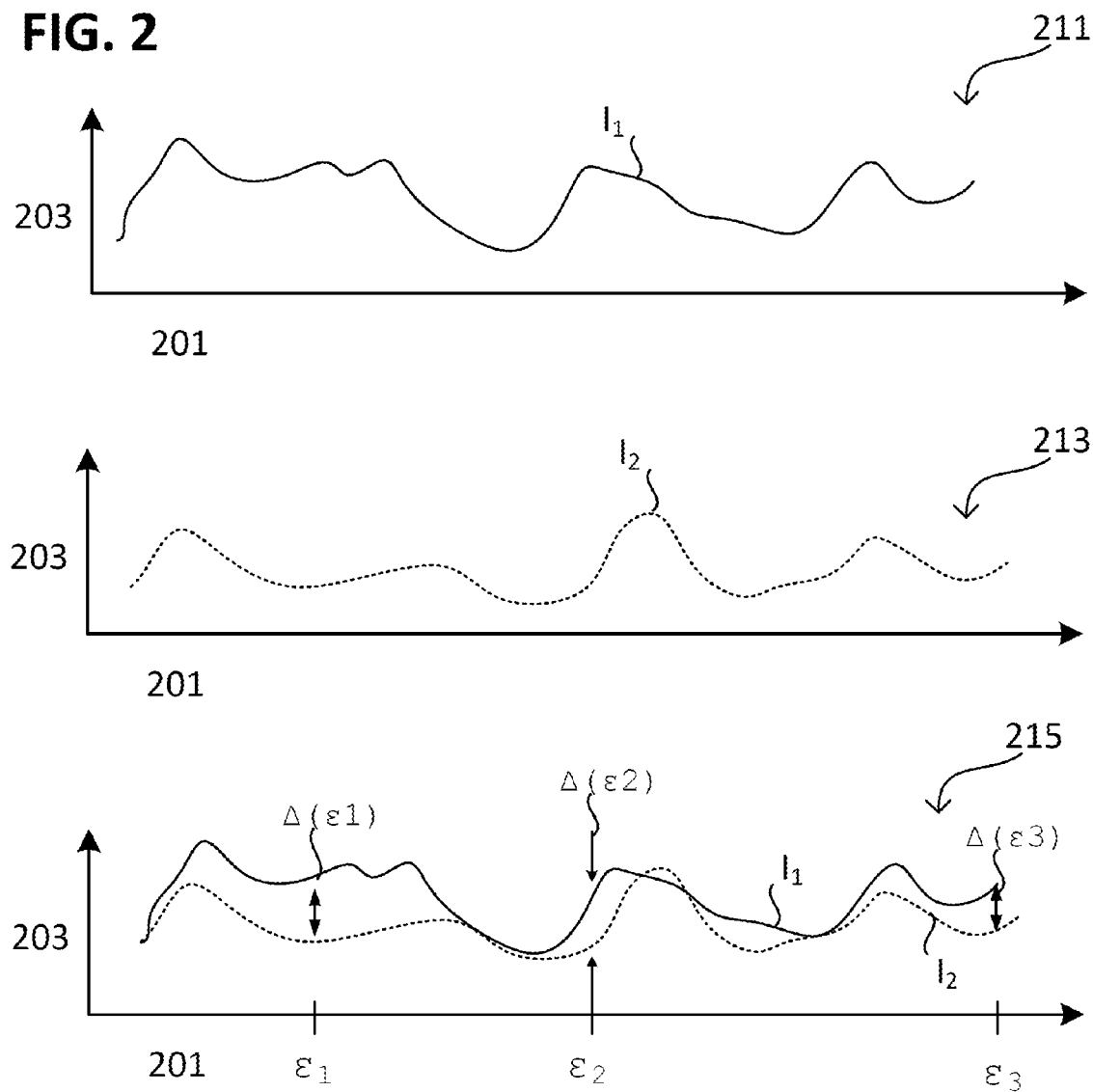
FIG. 2 shows the method in a plurality of schematic diagrams.

FIG. 2 illustrates the method 100, 300 in a plurality of schematic diagrams 211, 213 and 215, in which an optical spectrum is illustrated as a radiometric (e.g. photometric) quantity 203 against a kinematic quantity 201.

In accordance with various embodiments, a or the radiometric (e.g. photometric) quantity may represent a radiation energy (in joules) and/or the distribution thereof, e.g. the spatial distribution and/or temporal distribution thereof (e.g. power). By way of example, the radiometric quantity may comprise or be formed from one of the following quantities: a radiation power (in watts); a radiation energy (in joules); a radiation intensity (corresponds to radiation power per solid angle, in watts per steradian); an irradiance (corresponds to radiation power per effective receiver area, in watts per square metre); specific emission (corresponds to radiation power per effective emitter area, in watts per square metre); irradiation (corresponds to radiation energy per effective receiver area, in joules per square metre); and/or a radiance (corresponds to radiation power per solid angle and per effective emitter area, in watts per square metre and steradian). Illustratively, the radiometric quantity may represent a constitution of the electromagnetic radiation, e.g. the power thereof (energy per time), or the spatial distribution thereof (e.g. normalized to a solid angle and/or to an area of action). The radiometric (e.g. photometric) quantity may represent for example the radiation energy emitted by the image source, independently of whether it is self-emissive (e.g. emits light) or only reflects an irradiation (e.g. reflects light).

Referring to light, the radiation power may also be referred to as luminous flux, the radiation energy may be referred to as quantity of light, the radiation intensity may be referred to as light intensity, the irradiance may be referred to as illuminance, the specific emission may be referred to as specific light emission, the irradiation may be referred to as exposure and/or the radiance may be referred to as luminance. Light may be understood as electromagnetic radiation in a wavelength range of approximately 380 nm to approximately 780 nm.

The kinematic quantity 201 may represent an energetic composition of the detected radiation. By way of example, the kinematic quantity 201 may be a wavelength or a frequency.

In accordance with various embodiments, the spectrum may be understood to mean the relationship between the radiometric quantity 203 and the kinematic quantity 201. By way of example, the spectrum may assign a value of the radiometric quantity 203 for each value of the kinematic quantity 201. The spectrum may illustratively indicate the composition of a signal (e.g. of electromagnetic radiation), e.g. from various frequencies and/or wavelengths. The spectrum may indicate for example the proportion of the entire electromagnetic radiation that is constituted by radiation of a specific wavelength or frequency, e.g. the intensity and/or power thereof.

The spectrum may indicate as a function of the kinematic quantity 201, for example, with what intensity radiation is reflected and/or transmitted by the layer stack. By way of example, the spectrum may indicate the wavelength-dependent reflectance and/or wavelength-dependent transmittance.

The optical spectrum may be related to optical radiation. Optical radiation may generally be understood to mean ultraviolet radiation (10 nm-380 nm), infrared radiation (1 mm-780 nm) and/or the visible radiation (380 nm-780 nm) between them, i.e. electromagnetic radiation having a wavelength in a range of approximately 10 nm (nanometres) to approximately 1 mm (millimetre), e.g. having a wavelength in a range of approximately 300 nm to approximately 850 nm. In other words, the optical spectrum may relate to electromagnetic radiation having a wavelength in a range of approximately 10 nm to approximately 1 mm, e.g. having a wavelength in a range of approximately 300 nm to approximately 850 nm.

The method 100, 300 may comprise in 215 comparing two spectra (e.g. a first spectrum $I_1$ and a second spectrum $I_2$) with one another.

For the method 100, the first spectrum $I_1$ in 211 may comprise or be formed from, for example, a predefined spectrum $I_{desired}$ (also referred to as desired spectrum $I_{desired}$). The desired spectrum $I_{desired}$ may illustratively represent the optical properties sought, e.g. fulfil specific predefinitions. As an alternative or in addition to the method 100, for the method 300, the first spectrum $I_1$ may comprise or be formed from a spectrum $I_{actual}$ of the layer stack which is detected 301 (also referred to as spectrum detecting 301). The second spectrum $I_2$ may comprise or be formed from a spectrum $I_{actual}$ of the layer stack which is detected. The method 100, 300 may comprise in 211, 213, for example, detecting 103, 303 a spectrum $I_{actual}$ of the layer stack (also referred to as actual spectrum $I_{actual}$).

Detecting 103, 301, 303 the actual spectrum $I_{actual}$ (e.g. the or each partial spectrum) may comprise detecting the radiometric (e.g. photometric) quantity 203 for a plurality of values of the kinematic quantity 201 (e.g. for a plurality of wavelengths), e.g. for more than 10 (e.g. more than 25, than 50, than 100, than 120, than 250 or than 500) values of the kinematic quantity 201.

Optionally, the first spectrum $I_1$ (e.g. the first actual spectrum $I_{actual}$ and/or the desired spectrum $I_{desired}$) and/or the second spectrum $I_2$ may comprise or be formed from a discrete spectrum.

The first spectrum $I_1$ and/or the second spectrum $I_2$ may optionally comprise a plurality of partial spectra and/or be location-dependent. By way of example, one or more than one partial spectrum may be detected 103, e.g. at different locations of the layer stack and/or different types of spectra. By way of example, at least one of the following types of partial spectra may be detected: a reflection spectrum and/or a transmission spectrum. Alternatively or additionally, the partial spectrum may be an amplitude spectrum or frequency spectrum.

The location-dependent spectrum (also referred to as location spectrum) may comprise for example a plurality of partial spectra (e.g. two, three, four, five, six, seven, eight, nine, ten or more than ten), each partial spectrum of which is assigned to, e.g. correlates with, exactly one region (also referred to as layer region) of the layer stack. By way of example, it is possible to detect in each case a partial spectrum (e.g. a reflection spectrum and/or a transmission spectrum) at a first layer region and/or at a second layer region of the layer stack, e.g. at more than two (e.g. three, four, five, six, seven, eight, nine, ten or more than ten) layer regions. The or each layer region may be arranged for example in such a way that the latter may be intersected by a straight line. By way of example, the or each detection region may have at least one point, wherein the points are collinear (e.g. lying on the line). The line may be for example transverse with respect to the transport direction of the or each substrate, as will be described in even greater detail later.

The one or more than one partial spectrum may be summarized hereinafter as spectrum (e.g. actual spectrum $I_{actual}$ or respectively desired spectrum $I_{desired}$) for simplification.

The method 100 may comprise in 215 determining a spectral deviation of the first spectrum $I_1$ and/or of the second spectrum $I_2$ from one another. By way of example, the spectral deviation may comprise at least (in a first dimension) the same number of components as the number of partial spectra comprised by one of the two spectra (e.g. the first spectrum $I_1$ and/or the second spectrum $I_2$). Alternatively or additionally, the spectral deviation may comprise at least (in a second dimension) the same number of components as the number of values of the kinematic quantity 201 comprised by one of the two spectra (e.g. the actual spectrum $I_{actual}$) (e.g. as the number of measurement points present). In other words, the spectral deviation may comprise a tensor (e.g. a tensor of third or lower order), e.g. a matrix (i.e. a second-order tensor), e.g. a vector (i.e. a first-order tensor). The number of vectors accepted by a tensor is referred to as the rank or order of the tensor.

The multilinearity of the tensor makes it possible to express the values of the spectral deviation as a function on arbitrary basis vectors. By way of example, the tensor may comprise a first basis vector, which is a spatial vector, and/or a second basis vector, which is a kinematic vector. The values onto which a tensor maps the basis vectors are referred to as the components of the tensor.

In general, however, the spectral deviation (or more generally the tensor) may also be expressed in some other way. By way of example, the components of the tensor may also be written in a column one below another or next to one another. The more familiar tensors, matrices and vectors are used below. However, it may be understood that these may also be expressed more generally by tuple, which denotes the writing- and formulation-independent quantity of the respective components whose number defines the extent of the tuple. An n-tuple is a combination of n components. An n-tuple may likewise generally be mapped by means of an n-variate linkage or it is possible to map onto the n-tuple by means of the n-variate linkage.

The spectral deviation A illustrated in 215 may comprise three components, for example, each component of which is assigned to a value of the kinematic quantity 201 (e.g. a wavelength) $\varepsilon_1$ to $\varepsilon_3$.

The difference $\Delta(\varepsilon)=I_1(\varepsilon)-I_2(\varepsilon)$ at the values $\varepsilon_1$ to $\varepsilon_3$ may be expressed as a tuple $\Delta I=(\Delta(\varepsilon_1), \Delta(\varepsilon_2), \Delta(\varepsilon_3))$. To put it more generally, that may be the spectral deviation $\Delta I=(\Delta(\varepsilon_1), \ldots, \Delta(\varepsilon_n))$ for n values $\varepsilon_1$ to $\varepsilon_n$. (wherein n is a natural number and references the values).

Optionally, the method 100 may comprise determining the desired spectrum $I_{desired}$ as will be described in greater detail below. By way of example, a layer stack (also referred to as reference layer stack) formed before the first layer stack may be formed, e.g. on the first substrate or a substrate (also referred to as reference substrate) coated before the first substrate, the spectrum of which is used as desired spectrum $I_{desired}$.

Optionally, it is possible (e.g. for stabilizing the optical properties of the layer stack) to detect the transmission and the reflection on opposite sides of the coated substrate, i.e. on the substrate side (e.g. glass side) and on the layer stack side (i.e. coating side). The transmission and the reflection may be detected in a wavelength-dependent manner and in a laterally resolved manner transversely with respect to the transport direction. The detected measurement results are compared with previously determined or predefined setpoint values of the desired spectrum $I_{desired}$. Illustratively, data for power adaptation and for gas distribution for the individual magnetrons are generated from the spectral deviation.

Figure 3:
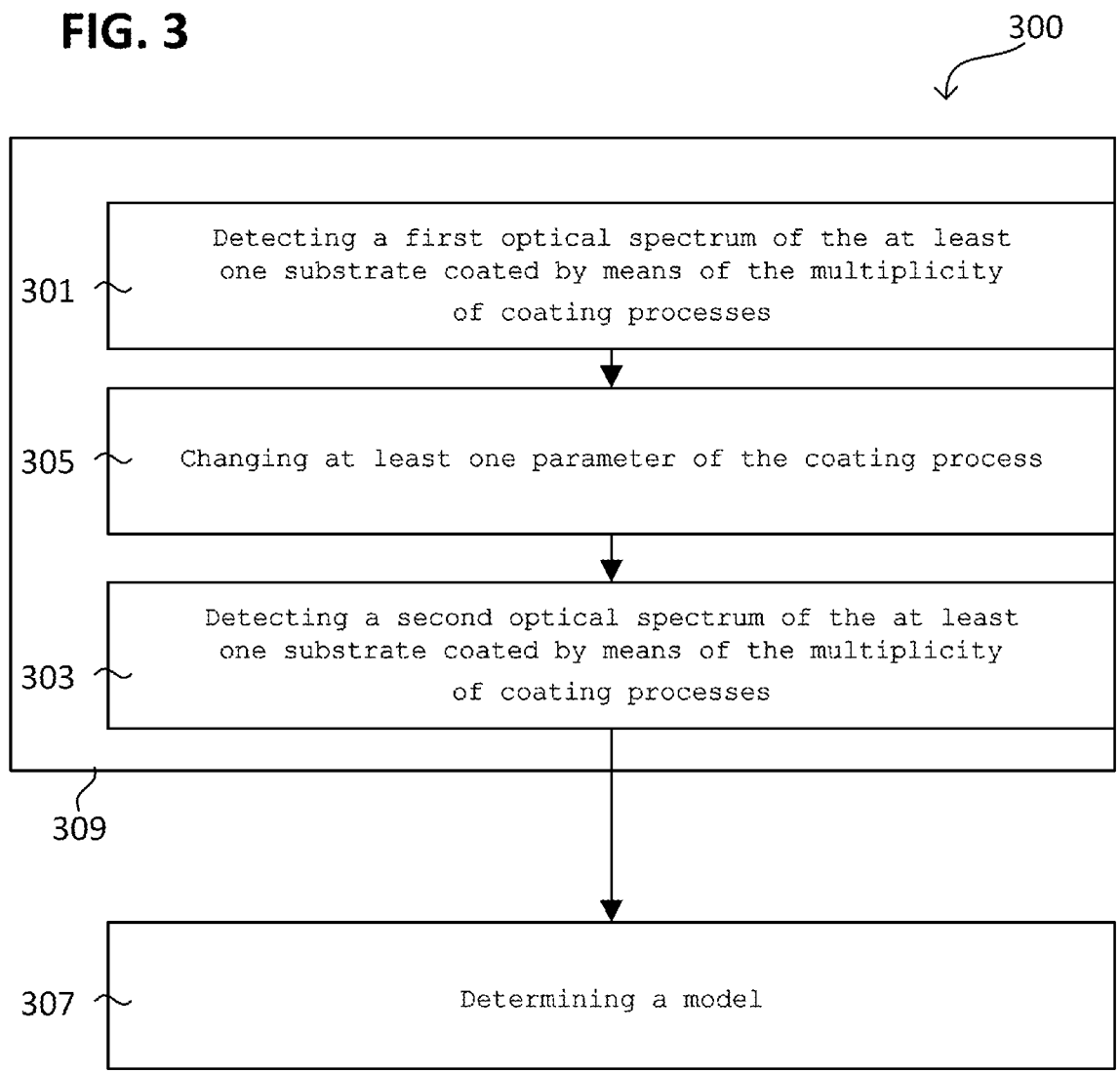
FIG. 3 shows a method in accordance with various embodiments in a schematic flow diagram.

FIG. 3 illustrates the method 300 in a schematic flow diagram in accordance with various embodiments.

The method 300 may comprise: in 309 varying a coating process of the multiplicity of coating processes and in 307 determining a model. The varying 309 may be carried out optionally for each coating process of the multiplicity of coating processes.

The varying 309 may comprise: in 301 detecting a first optical spectrum (also referred to as spectrum detecting 301) of the at least one substrate (which is coated e.g. with a first layer stack) coated by means of the multiplicity of coating processes, in 303 detecting a second optical spectrum (also referred to as spectrum detecting 303) of the at least one substrate (which is coated e.g. with a second layer stack) coated by means of the multiplicity of coating processes, in 305 changing at least one (i.e. exactly one or more than one, e.g. each) control parameter of the coating process.

The changing 305 may be carried out temporally between detecting the first optical spectrum and detecting the second optical spectrum.

The model may provide, for each coating process of the multiplicity of coating processes, a mapping function between a spectral deviation (i.e. of a corresponding second spectrum from the first spectrum) and the change in the at least one control parameter.

Optionally, varying 309 the coating process of the multiplicity of coating processes may be repeated. Optionally, the first optical spectrum and/or the second optical spectrum may be used as desired spectrum, e.g. in the method 100.

Figure 4:
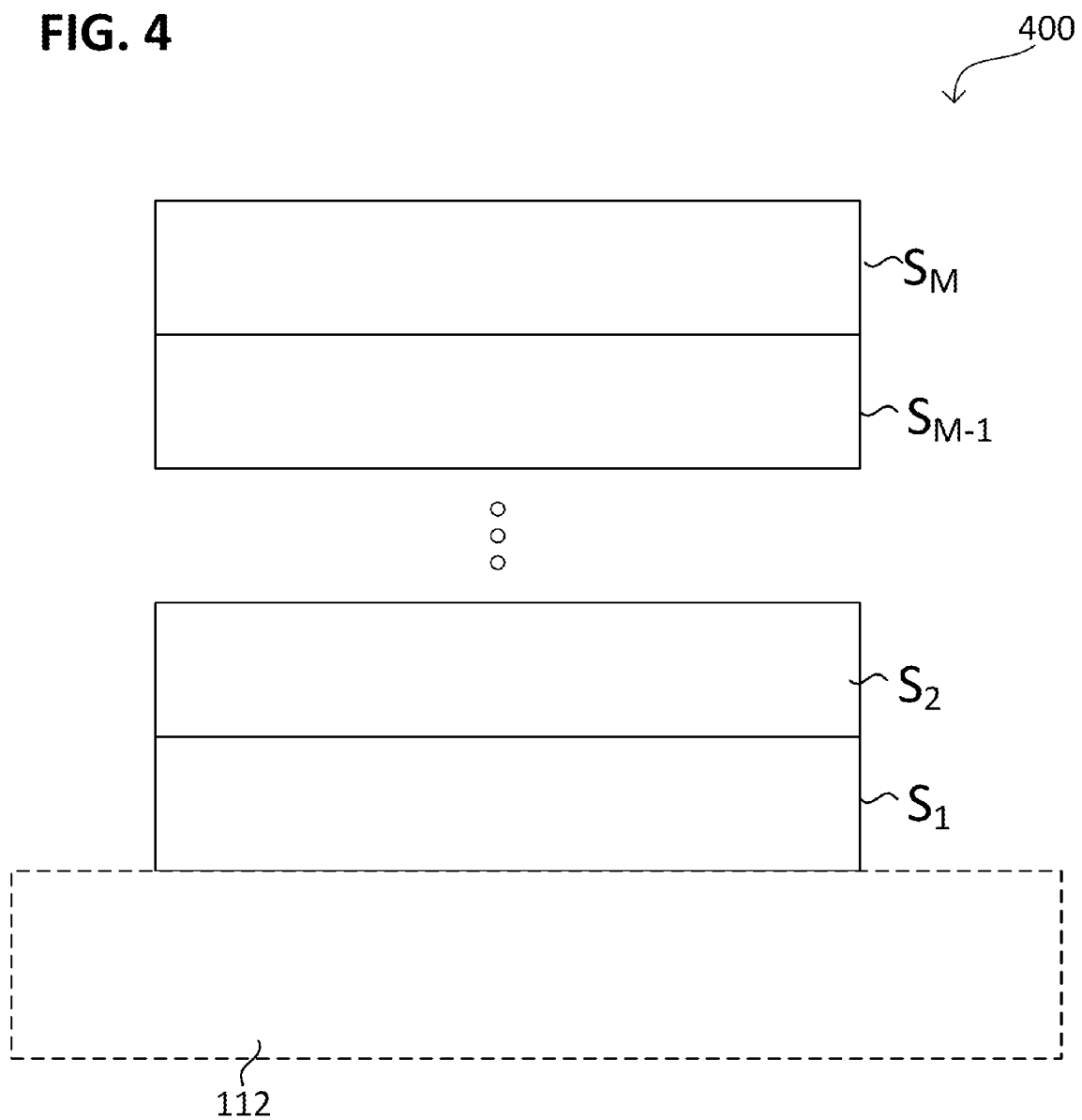
FIG. 4 shows a layer stack in a schematic side view or cross-sectional view in accordance with various embodiments.

FIG. 4 illustrates a layer stack 400 in a schematic side view or cross-sectional view in accordance with various embodiments.

The layer stack 400 may comprise a plurality of layers, e.g. M layers $S_1, \ldots, S_j, \ldots, S_M$, wherein j consecutively numbers (i.e. references) the layers and M is a natural number and denotes the number of layers of the layer stack 400. M may be for example greater than 5, 7, 10, 12, 14, 16, 20 or 25. In general, the actual spectrum $I_{actual}$ of the layer stack 400 may be dependent on the thickness d of each layer (also referred to as layer thickness d) of the layer stack 400. To facilitate understanding, hereinafter reference is made to the transmission spectrum T dependent on the wavelength $\lambda_i$ and the thickness of all the layers of the layer stack 400 is written as a vector $\vec{d}=(d_1, \ldots, d_j, \ldots, d_M)$, the j-th component $d_j$ of which indicates in each case the thickness of the j-th layer $S_j$. It goes without saying that the following explanations concerning the transmission spectrum T may generally be applied to a different spectrum, e.g. the first spectrum $I_1$ (e.g. first actual spectrum $I_{actual}$) and/or the second spectrum $I_2$ (e.g. second actual spectrum $I_{actual}$), and to a kinematic quantity 201 different from the wavelength (e.g. the frequency).

For a layer stack 400 consisting of M layers, the transmission $T(\lambda_i)$ of the wavelength $\lambda_i$ in the case of small layer thickness changes $\vec{\Delta d}$ may be written as a Taylor series expansion.

$$T(\lambda_i) = T_0(\lambda_i) + \frac{1}{1!}\overrightarrow{\left(\frac{\partial T(\lambda_i)}{\partial d_J}\right)}\vec{\Delta d} + \frac{1}{2!}\overrightarrow{\left(\frac{\partial^2 T(\lambda_i)}{\partial d_J \partial d_J}\right)}\vec{\Delta d^2} + \cdots \quad (1)$$

The vector $\vec{\Delta d}$ represents the layer thickness changes of the individual layers $S_1, \ldots, S_j, \ldots, S_M$ of the layer stack 400. The vector $\vec{\Delta d^2}$ represents the squares of the layer thickness changes and the individual layers $S_1, \ldots, S_j, \ldots, S_M$ of the layer stack 400.

For simplification, the first approximation shall be considered below.

To a first approximation, for small $\vec{\Delta d}$, the Taylor series expansion may be terminated after the first series element. Likewise, interactions among the layers, i.e. derivations of the form $$\overrightarrow{\left(\frac{\partial^2 T(\lambda_i)}{\partial d_J \partial d_k}\right)},$$

need not necessarily be taken into account.

To a first approximation, the following thus results:

$$T(\lambda_i) = T_0(\lambda_i) + \overrightarrow{\left(\frac{\partial T(\lambda_i)}{\partial d_J}\right)}\vec{\Delta d} \quad (2)$$

For simpler notation, $T(\lambda_i)$ for all measured wavelengths $\lambda_i$ may be written as a transmission vector $\vec{T(\lambda)}$, the i-th component of which indicates the transmission or transmittance at the i-th wavelength $\lambda_i$. The same correspondingly applies to $T_0(\lambda_i)$.

The first approximation may thus be written in matrix form, wherein the components of the matrix are derivations for all wavelengths, i.e. the following applies:

$$\vec{T(\lambda)} = \vec{T_0(\lambda)} + \overrightarrow{\left(\frac{\partial T(\lambda)}{\partial d_J}\right)}\vec{\Delta d} \quad (3)$$

The calibrating 300 may be carried out in accordance with this relation, as will be described in greater detail below.

To put it more generally, this relation then becomes $\vec{T(\lambda)} = \vec{T_0(\lambda)} + \hat{A}\vec{\Delta d}$. It may be understood that the matrix $\hat{A}$ takes account of the fact that the layer thickness d is dependent on exactly one control parameter. In the case of a plurality of control parameters, a further dimension may be added to the matrix $\hat{A}$, which further dimension takes account of a plurality of control parameters per layer, i.e. the matrix $\hat{A}$ transitions to a third-order tensor $\hat{A}$. Optionally, further influencing quantities may be taken into account, such that generally an n-th order tensor $\hat{A}$ may be used.

In general, the expression $\hat{A}\vec{\Delta d}$ may also be reformulated as an equation system comprising a plurality of equations, each equation of which is assigned to a component of $\vec{T(\lambda)}$. The equation system may comprise for example 30×480 variables, depending on complexity. Optionally, the equation system may be parameterized for carrying out an optimization method.

FIG. 5 illustrates the method 300 in a schematic flow diagram 500 in accordance with various embodiments.

Detecting 301 the first optical spectrum $I_1$ may comprise bringing the multiplicity of coating processes to a first operating point. At the first operating point, the first optical spectrum $I_1$, e.g. a first transmission spectrum $\vec{T_0(\lambda)}$, is detected 501a and/or stored 501a. In other words, at the first operating point, a first layer stack 400a is formed and its optical spectrum $I_1$ is detected.

Changing 305 at least one control parameter may comprise converting the first operating point into a second operating point. By way of example, at least one (i.e. exactly one or more than one) control parameter of a coating process may be changed, wherein the at least one control parameter changed defines the second operating point. By way of example, by means of changing the operating point for the second layer $S_2$ formed by means of the coating process, the second thickness $d_2$ is varied, as is illustrated by way of example in FIG. 5.

By way of example, a ratio of the change in the control parameter $\vec{\Delta R}$ to the value of the control parameter R (e.g. component by component $\vec{\Delta R_j}/\vec{R_j}$ and/or the magnitude $|\vec{\Delta R}/\vec{R}|$ thereof) may be less than a limit, which may for example be predefined (e.g. as upper limit). The limit may be for example approximately 0.01, e.g. approximately $10^{-3}$. In other words, the relative change in the control parameter $\vec{\Delta R}/\vec{R}$ may be smaller than the limit. By way of example, the relative change in the electrical power $\vec{\Delta P}/\vec{P}$ (e.g. component by component $\overrightarrow{\Delta P_j}/\overrightarrow{P_j}$ and/or the magnitude $|\overrightarrow{\Delta P}/\overrightarrow{P}|$ thereof) may be smaller than the limit. By way of example, the closed-loop control may be configured in such a way that the result of the mapping function (i.e. the function value) is restricted to the limit.

At the second operating point, the second optical spectrum $I_2$ may be detected 501b and/or stored 501b. In other words, at the second operating point, a second layer stack 400b is formed and its optical spectrum $I_2$ is detected 501b. At the j-th operating point, the j-th optical spectrum is detected 501j and/or stored 501j. In other words, at the j-th operating point, the j-th layer stack 400j is formed and its optical spectrum 501j is detected. Changing the operating point of the multiplicity of coating processes may be continued (e.g. M times) until each coating process of the multiplicity of coating processes has been changed at least once in terms of its control parameter.

As a result, by way of example, a plurality of (e.g. M) spectra $I_1, \ldots, I_j, \ldots, I_M$ are then present, each spectrum of which is assigned to a layer of the layer stack or the thickness variation $\Delta d$ thereof. The change in a j-th spectrum at the i-th wavelength $\lambda_i$ (i.e. that is assigned to the thickness $d_j$), i.e. $\Delta T(\lambda_i)/\Delta d_j$, for the j-th layer $S_j$ produces for example the ij-th components of the matrix $\hat{A}$.

Alternatively, at least some (e.g. all) of the components of the matrix $\hat{A}$ may be obtained by means of a simulation.

If a plurality of control parameters are varied for each coating process of the multiplicity of coating processes, a further dimension may be added to the matrix $\hat{A}$, which further dimension takes account of the plurality of control parameters, that is to say that the matrix $\hat{A}$ transitions to a third-order tensor $\hat{A}$. Optionally, further influencing quantities may be taken into account, such that generally an n-th order tensor $\hat{A}$ may be used.

In order to afford a better understanding, hereinafter reference shall firstly be made again to a matrix $\hat{A}$.

The above relation (3), rearranged with respect to $\overrightarrow{\Delta d}$, may also be written as:

$$\overrightarrow{\Delta d} = \left(\overline{\frac{\partial T(\vec{\lambda})}{\partial d_J}}\right)^{-1} (\overrightarrow{T(\lambda)} - \overrightarrow{T_0(\lambda)}) \qquad (4)$$

The expression $$\left(\overline{\frac{\partial T(\vec{\lambda})}{\partial d_J}}\right)^{-1}$$

denotes the inverse matrix $\hat{A}^{-1}$ and may be determined in various ways depending on the shape and form of the matrix $\hat{A}$. If the matrix $\hat{A}$ is not a square matrix, the so-called pseudoinverse of the matrix may be used, for example, instead of the inverse matrix $\hat{A}^{-1}$.

In general, the expression $$\left(\overline{\frac{\partial T(\vec{\lambda})}{\partial d_J}}\right)^{-1}$$

may be a left-inverse matrix of $\hat{A}$, that is to say that the latter may satisfy the relation $$\left(\overline{\frac{\partial T(\vec{\lambda})}{\partial d_J}}\right)^{-1} \hat{A} = \hat{I},$$

wherein $\hat{I}$ is the unit matrix.

To put it more generally, $\overrightarrow{\Delta d} = \hat{U}(\overrightarrow{T(\lambda)} - \overrightarrow{T_0(\lambda)})$, wherein $\overrightarrow{\Delta d}$ may be used as correction information on the basis of which changing 107 the at least one control parameter may be carried out. In general, the expression $\hat{U}$ may be a tensor of the same order as $\hat{A}$. In order to afford a better understanding, hereinafter reference shall be made firstly to matrices again.

By way of example, $\hat{U}$ may be the left-inverse matrix of $\hat{A}$ (also referred to as left inverse), that is to say that the latter may satisfy the relation $\hat{U}\hat{A}=\hat{I}$, wherein $\hat{I}$ is the unit matrix. Alternatively or additionally, the matrix $\hat{U}$ may be the pseudoinverse of $\hat{A}$.

The pseudoinverse of a matrix denotes a generalization of the inverse matrix to singular and non-square matrices, for which reason it is often also referred to as a generalized inverse. By way of example, the pseudoinverse may comprise or be formed from a Drazin inverse, a Bott-Duffin inverse or a Moore-Penrose inverse.

The left inverse may optionally (i.e. need not necessarily) satisfy the relation $\hat{A}\hat{U}=\hat{I}$. If the left inverse satisfies the relation $\hat{A}\hat{U}=\hat{I}$, the left inverse may be a pseudoinverse, for example. A matrix $\hat{U}$ may be a pseudoinverse of a matrix $\hat{A}$ precisely if it satisfies at least one (e.g. all) of the following relations: $\hat{A}\hat{U}\hat{A}=\hat{A}$ and $\hat{U}\hat{A}\hat{U}=\hat{U}$. The same applies to higher-order tensors.

The pseudoinverse and/or left inverse $\hat{U}$ may be implemented for example by means of a singular value decomposition or some other decomposition, e.g. by means of a QR decomposition.

As an alternative to the decomposition, an optimization method, e.g. a compensation calculation, may be used to determine the tensor $\hat{U}$. By way of example, it is possible to use a parameter matrix which is varied with the boundary condition to minimize the deviation (e.g. the square error deviation) of at least one (e.g. all) of the following relations $\hat{A}\hat{U}\hat{A}=\hat{A}$ and $\hat{U}\hat{A}\hat{U}=\hat{U}$. Alternatively or additionally, the boundary condition may be used to optimize the minimization of the change in the control parameter (e.g. a power change). Alternatively or additionally, the boundary condition may be used to optimize the situation in which the wavelengths for which the components of the tensor $\hat{A}$ are the highest and/or the latter satisfy a predefined criterion (e.g. exceed a threshold value) have a higher weighting in the optimization method.

Alternatively or additionally, a square matrix $\hat{A}$ may be formed from the non-square matrix $\hat{A}$, e.g. by removing its overdetermination. Alternatively or additionally, it is possible to remove all components of the j-th wavelength (i.e. e.g. a column) of the matrix whose sum is the smallest, e.g. recursively until the matrix $\hat{A}$ is square or at least one pseudoinverse and/or left inverse may be formed. In a similar manner, it is possible to use only those components $$\left(\overline{\frac{\partial T(\lambda_i)}{\partial d_J}}\right)$$

for forming the matrix $\hat{A}$ whose value is the largest and/or whose value satisfies a predefined criterion (e.g. exceeds a threshold value). The threshold value may be for example the mean value of all the components.

The set of wavelengths for which the components $$\overrightarrow{\left(\frac{\partial T(\lambda_i)}{\partial d_J}\right)}$$

are the largest and/or whose value satisfies the criterion may also be referred to as characteristic wavelengths. The method 300 may comprise, for example, determining the or each spectrum at the characteristic wavelengths.

The matrix $\hat{A}$ may be configured as square, for example, if the number of wavelengths $\lambda_i$ is equal to the number M of layers of the layer stack 400. However, the model may become more accurate the more wavelengths $\lambda_i$ are used. Therefore, the number of wavelengths $\lambda_i$ may be greater than the number M of layers of the layer stack 400, e.g. greater than double the number of layers, e.g. greater than five times the number of layers, e.g. greater than ten times the number of layers.

The tensor $\hat{U}$ may map the spectral deviation $\Delta I = I_1 - I_2$, e.g. $\Delta I = \overrightarrow{T(\lambda)} - \overrightarrow{T_0(\lambda)})$, onto the change in the layer thicknesses $\overrightarrow{\Delta d}$, e.g. subjectively and/or right-uniquely. In other words, the mapping function may provide a functional relationship between the spectral deviation $\Delta I = I_1 - I_2$ and the layer thickness $\overrightarrow{\Delta d}$, e.g. a mapping specification, in accordance with which an expression $\hat{U}$ maps the spectral deviation $\Delta I = I_1 - I_2$, e.g. $\Delta I = (\overrightarrow{T(\lambda)} - \overrightarrow{T_0(\lambda)})$, onto the change in the layer thicknesses $\overrightarrow{\Delta d}$ (or more generally the correction information).

By way of example, the tensor $\hat{U}$ may be configured to map, e.g. right-uniquely, from a first set (also referred to as the domain of definition) to a second set (also referred to as the target set). Optionally, the target set may have a smaller dimension (i.e. number of linearly independent basis vectors) than the domain of definition.

By way of example, the tensor $\hat{U}$ may be configured to map the spectral deviation uniquely onto the (i.e. exactly one piece of) correction information. In general, the mapping function may comprise or be formed from a mathematical (e.g. explicit and/or linear) mapping specification (e.g. a function or formula) which is right-unique.

For this purpose, $I_1$ (e.g. $\overrightarrow{T_0(\lambda)}$) may be used as the desired spectrum and $I_2$ (e.g. $\overrightarrow{T(\lambda)}$) may be the actual spectrum $I_{actual}$ to be measured. In other words, $\overrightarrow{\Delta d} = \hat{U}(I_{actual} - I_{desired})$.

Illustratively, the vector of the change in the layer thicknesses $\overrightarrow{\Delta d}$ (also referred to as layer thickness change $\overrightarrow{\Delta d}$) may be determined from the spectral deviation $\Delta I$ for setpoint predefinition, i.e. $\Delta I = I_{actual} - I_{desired}$, by multiplication by the inverse matrix $\hat{U}$ of the derivations. The vector of the layer thickness changes $\overrightarrow{\Delta d}$ and the spectrum vector $I_1$, $I_2$ (e.g. transmission vector $\overrightarrow{T_0(\lambda)}$) may differ in terms of their dimension and/or basis. The dimension of the vector of the layer thickness changes $\overrightarrow{\Delta d}$ corresponds for example to the number of all layers which are controllable independently of one another. Alternatively or additionally, the dimension of the spectrum vector $I_1$, $I_2$ corresponds for example to the number of all detected wavelengths.

To put it more generally, a model 511 may be provided 307 which, by means of the mapping function, provides a mathematical linkage between the spectral deviation $\Delta I$ and the layer thickness change $\overrightarrow{\Delta d}$. The mathematical linkage may also be provided by means of some other functional relationship and/or be multivariate.

On the basis of the layer thickness change $\overrightarrow{\Delta d}$ determined, the present layer thicknesses d of the individual layers may be corrected, e.g. in order to return the actual spectrum (e.g. the transmission) to the desired spectrum (e.g. the setpoint value).

For the same layer stack 400, determining 307 the model 511 may be carried out only once, for example. The model 511, once determined, may be implemented in a control device that carries out the open-loop control and/or closed-loop control of the multiplicity of coating processes.

The model 511 makes it possible to carry out for example the calculation of the vector of the layer thickness change $\overrightarrow{\Delta d}$ exclusively on the basis of fundamental computation operations (e.g. addition and multiplication). This simplifies the implementation of the model 511 in the control device.

FIG. 6 illustrates the method 300 in a schematic flow diagram 600 in accordance with various embodiments.

The change in the layer thickness $\Delta d_j$ of the j-th layer $S_j$ may be linked with changing 107, 305 the control parameter of the respective coating process of the multiplicity of coating processes that is used for producing it. By way of example, changing 107, 305 the control parameter may bring about and/or be a change of the electrical power P fed to the coating process, e.g. a change of the sputtering power. By way of example, there may be a monotonic relationship between the layer thickness $d_j$ and the control parameter, e.g. the electrical power P.

This circumstance may be used to relate the model 511 to the control parameters $R_1, \ldots, R_M$ of the multiplicity of coating processes.

To a first approximation of a Taylor expansion, analogously to the relations (3) and (4), it is then the case that $$\overrightarrow{T(\lambda)} = \overrightarrow{T_0(\lambda)} + \left(\overrightarrow{\frac{\partial T(\lambda)}{\partial P_J}}\right)\overrightarrow{\Delta P} \tag{5}$$

$$\overrightarrow{\Delta P} = \left(\overrightarrow{\frac{\partial T(\lambda)}{\partial P_J}}\right)^{-1}\left(\overrightarrow{T(\lambda)} - \overrightarrow{T_0(\lambda)}\right) \tag{6}$$

The vector $\overrightarrow{\Delta P}$ denotes by way of example the change in the electrical power P analogously to the vector notation of the layer thickness change $\overrightarrow{\Delta d}$.

To put it more generally, $\overrightarrow{\Delta P} = \hat{U}(\overrightarrow{T(\lambda)} - \overrightarrow{T_0(\lambda)})$, wherein the tensor $\hat{U}$ here is related to the electrical power and $\overrightarrow{\Delta P}$ may be used as correction information.

In general, instead of the transmission spectrum it is possible to use some other spectrum $I_1$, $I_2$ and instead of the electrical power P it is also possible to use some other control parameter R, the change of which in vector notation is the correction information $\overrightarrow{\Delta R}$. In that case, $\overrightarrow{\Delta R} = \hat{U}(I_1 - I_2)$, i.e. $\overrightarrow{\Delta R} = \hat{U}\Delta I$.

In general, the correction information may represent a change to be made to the control parameter R, e.g. a difference by which the latter is intended to be changed. The correction information $\vec{\Delta R}$ may comprise or be formed from a power change ΔP, for example.

FIG. 7A and FIG. 7B illustrate a coating installation 700a, 700b in the method 100 and/or the method 300 in a schematic side view or cross-sectional view in accordance with various embodiments.

In accordance with various embodiments, a coating installation 700a, 700b may comprise at least one vacuum chamber 102, e.g. in order to coat at least one substrate 112 therein by means of the multiplicity of coating processes. By way of example, the coating installation 700a, 700b may comprise a multiplicity of coating regions 706a to 706M, in each coating region of which a coating process of the multiplicity of coating processes is carried out. Optionally, coating regions 706a to 706M may be mutually gas-separated from one another, e.g. by means of chamber walls, partition walls, flow resistances, constrictions or the like.

Furthermore, the coating installation 700a, 700b may comprise a transport device 108 for transporting the at least one substrate 112 along a transport path 111p or in a transport direction 111p through the at least one vacuum chamber 102, e.g. through the multiplicity of coating regions 706a to 706M. Furthermore, the coating installation 700a, 700b may comprise a multiplicity of coating devices 704a to 704M, each coating device of which provides a coating process of the multiplicity of coating processes, i.e. forms at least one layer of the layer stack 400. The or each coating device 704a to 704M may be configured for emitting at least one coating material in the direction of the transport path 111p and/or the transport surface 111f, which coating material, having been deposited on the at least one substrate 112, forms the respective layer $S_1, \ldots, S_M$.

The at least one vacuum chamber 102 may be provided by means of a chamber housing. The at least one vacuum chamber 102 may be configured to generate and/or to maintain a vacuum therein. By way of example, the coating installation 700a, 700b may comprise a plurality of vacuum chambers, of which for example in each case two vacuum chambers that are directly adjacent to one another adjoin one another. The plurality of vacuum chambers 102 may be connected to one another by means of a substrate transfer opening, such that these form e.g. a common vacuum system. The vacuum system may be closed off towards the outside substantially in air-tight fashion, e.g. by means of at least one valve, at least one chamber cover and/or at least one transfer opening flap.

In accordance with various embodiments, the coating installation 700a, 700b may comprise a vacuum pump arrangement 814 (comprising at least one main vacuum pump and/or a coarse vacuum pump). The vacuum pump arrangement 814 may be configured to extract a gas (e.g. a process gas) from the at least one vacuum chamber 102, such that a vacuum (i.e. a pressure of less than 0.3 bar) and/or a pressure in a range of approximately $10^{-3}$ millibar (mbar) to approximately $10^{-7}$ mbar (in other words high vacuum) or a pressure of less than high vacuum, e.g. less than approximately $10^{-7}$ mbar (in other words ultra-high vacuum) may be provided within the vacuum chamber 102. The process gas may comprise one working gas and optionally one reactive gas or a gas mixture composed of a plurality of working gases and a plurality of optional reactive gases.

In accordance with various embodiments, the coating installation 700a, 700b may comprise the control device 1802, which may be coupled (illustrated by dashed lines) to one or more constituent parts of the coating installation 700a, 700b for the open-loop control and/or closed-loop control of the operating point (illustratively defining the process conditions) of the multiplicity of coating processes. The control device 1802 may optionally be configured as a closed-loop control device, that is to say that the controlled system thereof may be part of a closed-loop control circuit.

By way of example, the control device 1802 may be configured in such a way that the process atmosphere within the vacuum chamber 102 may be set or controlled by closed-loop control, e.g. during coating. By way of example, the parameters of the process atmosphere may be used as control parameters, e.g. the process pressure, the process temperature, the chemical composition of the process gas and/or the spatial and/or temporal distribution thereof.

In accordance with various embodiments, the coating installation 700a, 700b may comprise a gas supply 708. By means of the gas supply 708, a process gas may be fed to the vacuum chamber 102 for the purpose of forming a process atmosphere in the vacuum chamber 102. The process pressure may form from an equilibrium of process gas which is fed by means of the gas supply 708 and is extracted by means of the vacuum pump arrangement 814.

In accordance with various embodiments, the reactive gas may comprise at least one of the following: hydrogen, water (in gaseous form, e.g. water vapour), oxygen, nitrogen, hydrogen sulfide, methane, gaseous hydrocarbons, fluorine, chlorine, or some other gaseous material. Alternatively or additionally, the working gas may comprise or be formed from an inert gas, such as, for example, a noble gas, e.g. argon. The reactive gas may have a higher chemical reactivity than the working gas, e.g. with regard to the coating material.

By way of example, the gas supply 708 and/or the vacuum pump arrangement 814 may be controlled by open-loop and/or closed-loop control by means of the control device 1802. By way of example, the parameters of the gas supply 708 and/or of the vacuum pump arrangement 814 may be used as control parameters, e.g. gas inflow, gas outflow and/or the spatial distribution of the gas inflow and/or gas outflow.

In accordance with various embodiments, the transport device 108 of the coating installation 700a may comprise a take-off roll 1002a for taking off a strip-shaped substrate 112 in the direction of the coating region 706. Furthermore, the transport device 108 of the coating installation 700a may comprise a take-up roll 1002b for taking up the strip-shaped substrate 112 that is transported from the direction of the coating region 706.

A strip-shaped substrate 112 (strip substrate) may comprise or be formed from a film, a non-woven fabric, a strip and/or a woven fabric. By way of example, a strip-shaped substrate 112 may comprise or be formed from a metal strip, a metal film, a plastic strip (polymer strip) and/or a plastic film (polymer film). In accordance with various embodiments, the strip substrate 112 may comprise or be formed from any desired material, e.g. a metal, a semimetal, a polymer, a glass, or any other material which may be processed with a correspondingly small material thickness and/or as fibres by means of rolls 700 or rollers 700. Illustratively, a strip substrate may be any desired substrate 112 which may be wound up and/or unwound on a roll 1002a, 1002b and/or may be processed for example from roll to roll. Depending on material, a strip substrate 112 may have a thickness in a range of approximately a few micrometres, (e.g. of approximately 1 µm) to approximately a few millimetres (e.g. up to approximately 10 mm).

In accordance with various embodiments, the substrate transport device 108 of the coating installation 700a may comprise a multiplicity of transport rolls 700 which define an (e.g. singly or multiply curved) transport path 111p (or a correspondingly singly or multiply curved transport surface 111f) along which the strip-shaped substrate 112 is transported past the plasma forming region 106 between the take-off roll 1002a and the take-up roll 1002b.

As an alternative thereto, the transport device 108 of the coating installation 700b may comprise a multiplicity of transport rolls 700 configured for transporting a plate-shaped substrate 112. The plate-shaped substrate 112 may be transported e.g. in a manner bearing on the transport rolls 700 and/or in a manner inserted into a substrate carrier 1110.

Furthermore, the transport device 108 may comprise a transport drive 1602, which is coupled at least to a portion of the multiplicity of transport rolls 700 and optionally to the take-off roll 1002a and the take-up roll 1002b. By way of example, the transport drive 1602 may be coupled to the rolls 700, 1002a, 1002b by means of chains, belts or gearwheels. The transport rolls 700 and the transport drive 1602 may be part of the substrate transport device 108.

Optionally, the control device 1802 may be configured for controlling the transport device 108 (e.g. the transport drive 1602 thereof) by open-loop and/or closed-loop control.

By way of example, the parameters of the transport device 108 may be used as control parameters, e.g. a transport speed, a substrate position, a substrate flow rate, etc.

Furthermore, the control device 1802 may be configured for controlling the process of forming the layer stack 400 by open-loop and/or closed-loop control. By way of example, the parameters of each coating device of the multiplicity of coating devices 704a to 704M and/or the energy supply thereof may be used as control parameters, e.g. an electrical power consumed, an electrical voltage applied, an electrical current consumed and/or an emission rate.

In accordance with various embodiments, a coating device may be configured for coating the at least one (i.e. exactly one or more than one) substrate 112 which is transported e.g. through the respective coating region. By way of example, the coating device may be configured for providing a gaseous coating material (material vapour) and/or liquid coating material which may be deposited e.g. on the at least one substrate 112 in order to form a layer. A coating device may comprise at least one of the following: a sputtering device, a thermal evaporation device (e.g. a laser beam evaporator, an arc evaporator, an electron beam evaporator and/or a thermal evaporator), a precursor gas source, a liquid phase sputterer. A sputtering device may be configured for sputtering the coating material by means of a plasma. A thermal evaporation device may be configured for evaporating the coating material by means of thermal energy. Depending on the constitution of the coating material, as an alternative or in addition to thermal evaporation, i.e. thermal conversion of a liquid state (liquid phase) into a gaseous state (gaseous phase), sublimation, i.e. thermal conversion of a solid state (solid phase) into a gaseous state, may also occur. In other words, the thermal evaporation device may also sublimate the coating material. A liquid phase vaporizer may be configured for applying a coating material from the liquid phase, e.g. a dye.

By way of example, the coating material may comprise or be formed from at least one material of the following materials: a metal; a transition metal, an oxide (e.g. a metal oxide or a transition metal oxide); a dielectric; a polymer (e.g. a carbon-based polymer or a silicon-based polymer); an oxynitride; a nitride; a carbide; a ceramic; a semimetal (e.g. carbon); a perovskite; a glass or vitreous material (e.g. a sulfidic glass); a semiconductor; a semiconductor oxide; a semiorganic material, and/or an organic material.

Furthermore, the coating installation 700a, 700b may comprise a sensor arrangement 714 configured to detect an optical spectrum of the at least one substrate 112 coated. The sensor arrangement 714 may comprise one or more than one optical sensor (e.g. spectrometer or spectral photometer), e.g. one or more than one optoelectronic sensor.

The sensor arrangement 714 (e.g. a spectrometer arrangement) may be configured to provide the differentiation of the wavelengths of the radiation to be analysed. By way of example, this may be brought about by means of a directional deflection of the radiation to be analysed (e.g. by means of refraction and/or diffraction). For this purpose, the sensor arrangement 714 may comprise e.g. at least one prism and/or one optical grating. Alternatively or additionally, frequency components may be detected in an interferometer on the basis of a Fourier analysis (e.g. in an FTIR spectrometer).

Optionally, the sensor arrangement 714 may comprise one or more than one optical radiation source configured to emit optical radiation (also referred to as reference radiation), e.g. visible light, in the direction of the transport path 111p. The or each radiation source may comprise or be formed from, for example, an optoelectronic radiation emitter (e.g. a solid emitter, such as, for example, a light-emitting diode, a spontaneous or stimulated radiation emitter), a gas discharge emitter (e.g. a fluorescent lamp) and/or a plankton radiation emitter (e.g. comprising an incandescent filament).

At least one or each radiation source of the sensor arrangement 714 and at least one or each optical sensor of the sensor arrangement 714 may be arranged on opposite sides of the transport path 111p (e.g. for determining a transmission spectrum). Alternatively or additionally, at least one or each radiation source of the sensor arrangement 714 and at least one or each optical sensor of the sensor arrangement 714 may be arranged on the same side of the transport path 111p (e.g. for determining a reflection spectrum).

The sensor arrangement 714 may be arranged within and/or outside the vacuum chamber 102. By way of example, the sensor arrangement 714 may comprise both at least one optical sensor within and at least one optical sensor outside the vacuum chamber 102.

FIG. 8 illustrates the method 100 and/or the method 300 in a schematic flow diagram 800 in accordance with various embodiments.

The control device 1802 may be configured to carry out the method 100 and/or the method 300. By way of example, the control device 1802 may be configured to detect 103, 301, 303 at least one (e.g. one or more than on) spectrum 501 of the at least one substrate coated (also referred to as spectrum detecting 103, 301, 303) by means of the sensor arrangement 714.

Furthermore, the control device 1802 may be configured to determine 307 the model 511 (also referred to as model determining 307) and/or to control 107 by open-loop and/or closed-loop control the at least one (e.g. each) coating process of the multiplicity of coating processes (also referred to as process controlling 107) using the model 511.

The model determining 307 and/or the process controlling 107 may be carried out for example using the at least one spectrum 501 detected, e.g. the first spectrum $I_1$ and/or the second spectrum $I_2$.

The control device 1802 may implement for example the model 511, e.g. by means of software 818 and/or a hardwiring 818. Alternatively or additionally, the control device 1802 may implement the method 100 and/or the method 300, e.g. by means of software 818 and/or a hardwiring 818.

The control device 1802 (e.g. its controller) may comprise for example a PI-controller (also referred to as proportional-integral controller). A PI-controller may comprise a P-element (proportional element) and an I-element (integral element), which are coupled to one another. As an alternative or in addition to the PI-controller, other types of controller may be used, e.g. a P-controller (comprising only the P-element), an I-controller (comprising only the I-element), a D-element (comprising only a derivative element), a PD-controller, a PD2-element having complex conjugate zeros and/or a PID-controller.

The PI-controller shall be described by way of example below. In this controller, the correction information $\vec{\Delta R}$ (illustratively the change vector) may be formed as a sum of proportional and integral components. This yields:

$$\vec{\Delta R} = \left(\overline{\frac{\partial I(\lambda)}{\partial R_J}}\right)^{-1} \left(V_R\left(\overline{I_1(\lambda)} - \overline{I_2(\lambda)}\right) + V_I \int \left(\overline{I_1(\lambda)} - \overline{I_2(\lambda)}\right) dn\right) \quad (7)$$

or alternatively expressed $$\vec{\Delta R} = V_R\left(\overline{x(\lambda)} - \overline{x_0(\lambda)}\right) + V_I \int \left(\overline{x(\lambda)} - \overline{x_0(\lambda)}\right) dn \text{ where} \quad (8)$$

$$\overline{x(\lambda)} = \left(\overline{\frac{\partial I(\lambda)}{\partial R_J}}\right)^{-1} \overline{I(\lambda)}$$

If the correction information $\vec{\Delta R}$ is related to the power P, it may be that $\vec{\Delta R} = \vec{\Delta P}$, whereby in the case of a transmission spectrum T:

$$\vec{\Delta P} = \left(\overline{\frac{\partial T(\lambda)}{\partial p_J}}\right)^{-1} \left(V_P\left(\overline{T(\lambda)} - \overline{T_0(\lambda)}\right) + V_I \int \left(\overline{T(\lambda)} - \overline{T_0(\lambda)}\right) dn\right)$$

or alternatively expressed $$\vec{\Delta P} = V_P\left(\overline{x(\lambda)} - \overline{x_0(\lambda)}\right) + V_I \int \left(\overline{x(\lambda)} - \overline{x_0(\lambda)}\right) dn \text{ with}$$

$$\overline{x(\lambda)} = \left(\overline{\frac{\partial T(\lambda)}{\partial P_J}}\right)^{-1} \overline{T(\lambda)}$$

It is evident from the structure of these relations, for example, that a PI-controller exists for any wavelength $\lambda_i$.

If a plurality of partial spectra are detected, they may optionally be weighted among one another, e.g. differently from one another. By way of example, at least four partial spectra (i.e. four measurement data spectra) may be detected, e.g. exactly one transmission spectrum and three reflection spectra.

By way of example, each partial spectrum of the plurality of (e.g. exactly S) partial spectra may be weighted by means of a weighting factor $V_1, \ldots, V_S$. By way of example, the correction information may comprise a plurality of components $\vec{\Delta R}_1, \ldots, \vec{\Delta R}_S$, each component of which is assigned to exactly one partial spectrum of the actual spectrum. The correction information $\vec{\Delta R}$ may then be determined for example in accordance with $$\vec{\Delta R} = V_1 \vec{\Delta R}_1 + \ldots + V_S \vec{\Delta R}_S$$

To put it more generally, the correction information may be $\vec{\Delta R} = \vec{\Delta R}(V_1, \vec{\Delta R}_1, \ldots, \vec{\Delta R}_S)$. The weighting factors $V_1, \ldots, V_S$ may optionally satisfy a boundary condition, e.g. that their sum satisfies a predefined criterion, e.g. is equal to 1. By way of example, in the case of equivalence, each weighting factor may have the value 1/S. Accordingly, in the case of four partial spectra, each weighting factor may have the value 0.25.

Alternatively or additionally, the weighting factors $V_1, \ldots, V_S$ may differ among one another and/or each may differ from 1/S.

By way of example, a partial spectrum of the actual spectrum may be a transmission spectrum (indicated by index T). Alternatively or additionally, a partial spectrum of the actual spectrum may be a reflection spectrum of the substrate side (indicated by index RG). Alternatively or additionally, a partial spectrum of the actual spectrum may be a reflection spectrum of the coated side (indicated by index RF). Alternatively or additionally, a partial spectrum of the actual spectrum may be a partial spectrum averaged over a plurality of detection regions (indicated by index R55).

By means of weighted addition of the power change vectors respectively determined, the latter may be combined for example to form a common vector, such that $$\vec{\Delta P} = V_T \vec{\Delta P}_T + V_{RG} \vec{\Delta P}_{RG} + V_{RF} \vec{\Delta P}_{RF} + V_{R55} \vec{\Delta P}_{R55} \quad (9)$$

wherein optionally $$1 = V_T + V_{RG} + V_{RF} + V_{R55} \quad (10)$$

For communication with the sensor arrangement 714 and the multiplicity of coating devices 704a to 704M, the control device 1802 may comprise corresponding interfaces 816. The circuit 818 may for example comprise one or more than one processor, be programmed and/or execute instructions (e.g. machine code, code segments, interpreter-executable code and/or source code) that are stored on a memory (e.g. of the control device 1802). Code segments may comprise for example pure machine code after the source code has been compiled.

Optionally, the model 511 may comprise a plurality of mapping functions, each mapping function of which is assigned to a configuration of a layer stack. The layer stacks or mapping functions assigned thereto may for example differ from one another, i.e. have different configurations. Optionally, the control device 1802 may provide for switching between the plurality of mapping functions. A coating installation may thus be converted rapidly and in an uncomplicated manner.

FIG. 9 illustrates the method 100 and/or the method 300 in a schematic plan view 900 (e.g. with the viewing direction towards the transport surface 111f) in accordance with various embodiments.

The sensor arrangement 714 may be configured to provide a plurality of (e.g. three, four, five, six, seven, eight, nine, ten or more than ten) detection regions 714a to 714L, in each detection region of which the sensor arrangement 714 may detect a partial spectrum. By way of example, the partial spectrum of a layer region of the layer stack 400 may be detected in each detection region.

The at least one coating process may comprise a plurality of control regions 724a to 724L, in which the coating process may be separately controlled by open-loop and/or closed-loop control by means of a control parameter $R_a, \ldots, R_L$. By way of example, one coating arrangement 704a, 704M (e.g. each of its coating devices) may comprise a plurality of separately controllable segments 724a, ..., 724L, e.g. segments of a gas feed, which are configured in such a way that they may be separately controlled by open-loop and/or closed-loop control by means of a control parameter $R_a, \ldots, R_L$.

In accordance with various embodiments, the method 100 and/or the method 300 may provide a plurality of (e.g. two, three, four, five, six, seven, eight, nine, ten or more than ten) tracks 901a, ..., 901L for process controlling 107 and/or spectrum detecting 103, 301, 303. The plurality of tracks may be arranged next to one another with respect to the transport direction 111p. Each track of the plurality of tracks 901a, ..., 901L may assign at least one control region of the at least one coating process to a detection region of the sensor arrangement 714.

The method 100 and/or the method 300 may comprise, or the control device 1802 may be configured for, providing an i-th control parameter $R_i$ for the i-th (e.g. for each) control region 724i of the at least one coating process. The i-th control parameter $R_i$ may be determined for example on the basis of the i-th partial spectrum, i.e. of the partial spectrum which is detected in the i-th detection region 714i assigned to the i-th control region 724i. To put it more generally, the method 100 and/or the method 300 may comprise, or the control device 1802 may be configured for, providing at least one control parameter for controlling the control region for each control region of the at least one coating process, wherein the at least one control parameter may be determined on the basis of a partial spectrum detected in the detection region assigned to the control region.

By way of example, the method 100 and/or the method 300 may provide a plurality of tracks. The number and relative position of the tracks with respect to one another may be configured in accordance with the sought quality of the layer stack 400.

By way of example, each control region may correlate with a gas inlet of the gas supply 708. By way of example, gas trimming may be carried out by means of the plurality of gas inlets.

By way of example, in each case one or more than one track (e.g. three tracks) may be provided for the opposite edge regions of the layer stack 400 and/or exactly one or more than one track may be provided in each case for the central regions of the layer stack 400.

By means of the K tracks, for each layer $S_j$ of the layer stack 400 an M-dimensional vector $\overrightarrow{\Delta R_{j^M}}$ (e.g. $\overrightarrow{\Delta P_{j^M}}$) arises as correction information, the components of which vector indicate for example change values for the power. The actual power change for all the coating devices (e.g. magnetrons) results from the mean value of the M change values $$\Delta P_j = \langle \Delta P_{jk} \rangle_k \quad (11)$$

This power change may optionally be distributed equally or be distributed in a weighted fashion among all coating devices participating in the multiplicity of coating processes.

From the differences between $\Delta P_{jk}$ and the mean value thereof, it is possible for example to correct the gas trimming distribution.

$$\Delta(\Delta P_{jk}) = \Delta P_{jk} - \langle \Delta P_{jk} \rangle_k \quad (12)$$

-continued
$$\Delta f_{jk} = \varphi_{jk}\left(\Delta(\Delta P_{jk}) - \Sigma_l(1-\delta_{lk})\frac{\Delta(\Delta P_{jl})}{(k-1)}\right) \quad (13)$$

In this case, $\Delta f_{jk}$ represents the flow change value of the k-th gas inlet of the j-th layer. This flow change may likewise be distributed equally among all participating coating devices. The $\varphi_{jk}$ may be an effective factor that is to be determined separately and that translates the power change into flow values.

By way of example, controlling the power of the at least one coating process may be implemented by means of a first control loop, and controlling the spatial distribution of the gas flow may be implemented by means of a second control loop connected downstream of the first control loop.

To put it more generally, determining a first control parameter of the at least one coating process may be implemented by means of a first control loop, and determining a second control parameter may be carried out by means of a second control loop connected downstream of the first control loop. The first control parameter may for example be a global control parameter (e.g. location-invariant) of the at least one coating process, represent an electrical quantity of the coating process and/or be an electrical control parameter. The second control parameter may for example be a location-dependent control parameter of the at least one coating process, represent a mechanical quantity (e.g. mass flow rate and/or volumetric flow rate) of the coating process and/or be a mechanical control parameter.

If a plurality of control parameters (e.g. each control parameter of which is assigned to exactly one track of the plurality of tracks) are determined for a or each layer, the first control loop may use the mean value thereof for closed-loop control and the second control loop may use the deviation thereof from the mean value for closed-loop control.

In accordance with various embodiments, a control device 1802 (e.g. comprising a controller) may be provided which implements the method 100 and/or the method 300, e.g. by means of software and/or by means of a circuit interconnection. Data representing the spectrum or the spectra may be fed (i.e. input) to the control device 1802 (e.g. the controller thereof). The control device 1802 may be configured to provide (e.g. to output) data representing the correction information, e.g. power correction data for the coating devices and/or correction data for the power flows and/or gas flows.

By way of example, the control device 1802 may comprise or be formed from a programmable logic controller (PLC). Alternatively or additionally, it is possible to use any other circuit which is able to be configured to carry out the method 100 and/or the method 300. By way of example, it is possible to configure a processor that carries out the method 100 and/or the method 300.

FIG. 10 illustrates a method 100, 300 for coating substrate material in accordance with various embodiments in a schematic flow diagram 1000. The substrate material may comprise one or more than one substrate. The method 100, 300 may comprise for example the method 100 and/or the method 300.

The method 100, 300 may comprise: in 1001 forming a first layer stack on a substrate material by means of a multiplicity of coating processes (e.g. each coating process of which forms at least one layer of the first layer stack); in 301 detecting a first optical spectrum of the first layer stack; in 305 changing at least one control parameter of at least one coating process of the multiplicity of coating processes; in 1007 forming a second layer stack on the substrate material of the multiplicity of coating processes using the at least one control parameter changed (e.g. each coating process of which forms at least one layer of the second layer stack); in 303 detecting a second optical spectrum of the second layer stack; in 307 determining a model, wherein the model provides a right-unique (e.g. linear) mapping function between the change in the at least one control parameter and a deviation of two spectra from one another; in 101 forming a third layer stack on the substrate material by means of a multiplicity of coating processes (e.g. each coating process of which forms at least one layer of the third layer stack); in 103 detecting a third optical spectrum of the third layer stack; in 105 determining a change to be made to the or a different at least one control parameter for the at least one coating process of the multiplicity of coating processes using the model; in 107 additionally changing the at least one control parameter of the at least one coating process of the multiplicity of coating processes using the correction; and in 109 forming a fourth layer stack on the substrate material by means of the multiplicity of coating processes using the at least one control parameter additionally changed (e.g. each coating process of which forms at least one layer of the second layer stack).

In 307, the two spectra may comprise or be formed from the first spectrum and the second spectrum. In other words, the model may be determined 307 using the first spectrum and the second spectrum.

In 105, the two spectra may comprise the third spectrum and a desired spectrum, wherein the desired spectrum may comprise or be formed from the first spectrum and/or the second spectrum, for example. In other words, the correction to be carried out may be determined 105 using the desired spectrum and the third spectrum.

Hereinafter, various examples are described which relate to what has been described above and what is illustrated in the figures.

Example 1 is a method 100, 300 for coating substrate material, wherein the substrate material comprises one or more than one substrate, and wherein the method 100, 300 comprises: forming 1001 a first layer stack on a substrate material by means of a multiplicity of coating processes; detecting 301 a first optical spectrum of the first layer stack; changing 305 at least one control parameter for controlling at least one coating process of the multiplicity of coating processes; forming 1007 a second layer stack on the substrate material of the multiplicity of coating processes using the at least one control parameter changed; detecting 303 a second optical spectrum of the second layer stack; determining 307 a model, wherein the model provides a right-unique (e.g. linear) mapping function between the change in the at least one control parameter and a deviation of two spectra from one another; forming 101 a third layer stack on the substrate material by means of a multiplicity of coating processes; detecting 103 a third optical spectrum of the third layer stack; 105 determining a change to be made (also referred to as correction) to the at least one control parameter for the at least one coating process of the multiplicity of coating processes using the model; additionally changing 107 the at least one control parameter of the at least one coating process of the multiplicity of coating processes using the change determined; and forming 109 a fourth layer stack on the substrate material by means of the multiplicity of coating processes using the control parameter additionally changed.

Example 2 is the method 100, 300 in accordance with Example 1, wherein when determining 307 the model, the two spectra comprise the first spectrum and the second spectrum.

Example 3 is the method 100, 300 in accordance with Example 1 or 2, wherein when determining 105 the change to be made, the two spectra comprise the third spectrum and a desired spectrum, wherein the desired spectrum optionally comprises the first spectrum and/or the second spectrum.

Example 4 is a method 100 for coating, comprising: forming 101 a first layer stack on a first substrate 112 by means of a multiplicity of coating processes, each coating process of which forms at least one layer of the first layer stack; detecting 103 an optical spectrum (also referred to as third optical spectrum) of the first layer stack; determining 105 correction information for at least one coating process of the multiplicity of coating processes using a model, wherein the model provides a right-unique (e.g. linear) mapping function (e.g. a functional relationship) between a deviation of the spectrum from a desired spectrum and the correction information; and changing 107 at least one control parameter for controlling the at least one coating process of the multiplicity of coating processes using the correction information; and forming 109 a second layer stack on the first or a second substrate 112 by means of the multiplicity of coating processes using the control parameter changed, each coating process of which forms at least one layer of the second layer stack.

Example 5 is a method 100, 300 in accordance with any of Examples 1 to 4, wherein the correction information is used as a control difference.

Example 6 is a method 100, 300 in accordance with any of Examples 1 to 5, wherein the control parameter changed is the sum of the control parameter and the control difference.

Example 7 is a method 100, 300 in accordance with any of Examples 1 to 6, wherein the correction information represents or comprises a change in a thickness of the at least one layer which is formed by means of the at least coating process.

Example 8 is a method 100, 300 in accordance with any of Examples 1 to 7, wherein the correction information represents or comprises a change in an electrical power by means of which the at least one coating process is supplied.

Example 9 is a method 100, 300 in accordance with any of Examples 1 to 8, wherein the correction information comprises a plurality of components, each component of which is assigned to a controllable region of the at least one coating process.

Example 10 is a method 100, 300 in accordance with any of Examples 1 to 9, wherein the at least one coating process has a plurality of control regions and the spectrum has a plurality of partial spectra, each partial spectrum of which is assigned to a control region of the at least one coating process, and wherein, for each control region of the at least one coating process, the at least one control parameter for controlling the control region is determined on the basis of the partial spectrum assigned to the control region.

Example 11 is a method 300 (illustratively for calibrating), comprising: coating at least one substrate 112 by means of a multiplicity of coating processes, each coating process of which forms at least one layer on the at least one substrate 112, wherein the following is carried out for each coating process of the multiplicity of coating processes: detecting 301 a first optical spectrum of the at least one substrate 112 coated by means of the multiplicity of coating processes; detecting 301 a second optical spectrum of the at least one substrate 112 coated by means of the multiplicity of coating processes; changing 305 at least one control parameter of a coating process of the multiplicity of coating processes between detecting 301 the first optical spectrum and detecting 303 the second optical spectrum; and determining a model, wherein the model provides a right-unique (e.g. linear) mapping function between a deviation of the second spectrum from the first spectrum and the change in the at least one control parameter.

Example 12 is a method 300 (illustratively for calibrating), comprising: forming 1001 a first layer stack on a first substrate 112 by means of a multiplicity of coating processes, each coating process of which forms at least one layer of the first layer stack, wherein the following is carried out for each coating process of the multiplicity of coating processes: detecting 301 a first optical spectrum of the first layer stack; changing 305 at least one control parameter for controlling the coating process of the multiplicity of coating processes; forming 1007 a second layer stack on the first substrate 112 or a second substrate 112 by means of the multiplicity of coating processes using the at least one control parameter changed, each coating process of which forms at least one layer of the second layer stack; detecting 303 a second optical spectrum of the second layer stack; and determining 307 a model, wherein the model provides, for all coating processes of the multiplicity of coating processes, a common (e.g. right-unique) mapping function between a deviation of the second spectrum from the first spectrum and the change in the at least one control parameter of each coating process of the multiplicity of coating processes.

Example 13 is a method 300 in accordance with Example 11 or 12, wherein determining the model comprises: determining a linear equation system, the coefficient matrix of which represents a ratio of the deviation to the change; and determining a pseudoinverse and/or left inverse of the coefficient matrix, wherein the pseudoinverse and/or left inverse provide(s) the mapping function.

Example 14 is a method 300 in accordance with any of Examples 11 to 13, wherein determining the model comprises: determining a first mapping, which maps the change onto the deviation; and determining a second mapping, which is the inverse mapping (e.g. left inverse or pseudoinverse) of the first mapping, wherein the second mapping provides the mapping function.

Example 15 is a method 300 in accordance with Example 13 or 14, wherein determining the inverse mapping (e.g. left inverse or pseudoinverse) is carried out by means of a singular value decomposition.

Example 16 is a method 100, 300 in accordance with any of Examples 1 to 15, wherein the mapping function is a multivariate mapping function (e.g. multi-digit linkage).

Example 17 is a method 100, 300 in accordance with any of Examples 1 to 16, wherein the deviation of the two spectra (i.e. the spectral deviation, e.g. the deviation of the third spectrum from the desired spectrum and/or of the first spectrum from the second spectrum) from one another has a plurality of components, each component of which is assigned to exactly one wavelength and/or each component of which comprises or represents a radiometric quantity of the two spectra at exactly one wavelength.

Example 18 is a method 100, 300 in accordance with any of Examples 1 to 17, wherein the deviation of the two spectra from one another has a plurality of components, each component of which is assigned to exactly one layer region of the layer stack (e.g. each component of which is related to a partial spectrum of the layer region).

Example 19 is a method 100, 300 in accordance with any of Examples 1 to 18, wherein the or each optical spectrum (e.g. the third spectrum, the desired spectrum, the first spectrum and/or the second spectrum) has a plurality of partial spectra, at least one partial spectrum of which is a transmission spectrum and/or at least one partial spectrum of which is a reflection spectrum.

Example 20 is a method 100, 300 in accordance with any of Examples 1 to 19, wherein the or each optical spectrum (e.g. the third spectrum, the desired spectrum, the first spectrum and/or the second spectrum) has a plurality of partial spectra which are weighted among one another and/or differently from one another by the model.

Example 21 is a method 100, 300 in accordance with Example 19 or 20, wherein each partial spectrum of the plurality of partial spectra is weighted by means of a weighting factor (wherein the weighting factors optionally differ from one another).

Example 22 is a method 100, 300 in accordance with any of Examples 1 to 21, wherein the mapping function (e.g. linkage) is an n-variate mapping function; and wherein the deviation of the spectrum from the desired spectrum has exactly n components, each component of which is assigned to exactly one wavelength and/or each component of which represents a difference in a radiometric quantity of the two spectra at exactly one wavelength.

Example 23 is a method 100, 300 in accordance with any of Examples 1 to 22, wherein the model (e.g. the mapping function) maps the deviation of the two spectra from one another uniquely (e.g. one-to-one) onto the correction information and/or onto the change in the at least one control parameter.

Example 24 is a method 100, 300 in accordance with any of Examples 1 to 23, wherein the model (e.g. the mapping function) provides an (e.g. linear) equation system, the coefficient matrix of which maps the deviation of the two spectra from one another onto the correction information and/or onto the change in the at least one control parameter.

Example 25 is a method 100, 300 in accordance with any of Examples 1 to 24, wherein the model (e.g. the mapping function) has an (e.g. linear) equation system, the coefficient matrix of which is non-square (e.g. has more rows than columns, or the other way round).

Example 26 is a method 100, 300 in accordance with either of Examples 24 and 25, wherein the coefficient matrix provides the mapping function.

Example 27 is a method 100, 300 in accordance with any of Examples 1 to 26, wherein the model (e.g. the mapping function) provides a right-unique and/or subjective relationship between the deviation of the two spectra from one another and the correction information and/or the change in the at least one control parameter.

Example 28 is a method 100, 300 in accordance with any of Examples 1 to 27, wherein the or each optical spectrum comprises an amplitude spectrum and/or frequency spectrum.

Example 29 is a method 100, 300 in accordance with any of Examples 1 to 28, wherein the or each optical spectrum comprises a reflection spectrum and/or transmission spectrum.

Example 30 is a method 100, 300 in accordance with any of Examples 1 to 29, furthermore comprising: transporting the substrate material (which comprises the first substrate 112 and optionally the second substrate 112) through a plurality of coating regions, in each coating region of which exactly one or more than one coating process of the multiplicity of coating processes is carried out.

Example 31 is a method 100, 300 in accordance with any of Examples 1 to 30, wherein the or each optical spectrum is a discrete (e.g. frequency-discrete or wavelength-discrete) spectrum and/or comprises one or more than one discrete (e.g. frequency-discrete or wavelength-discrete) partial spectrum.

Example 32 is a method 100, 300 in accordance with any of Examples 1 to 31, wherein detecting 103, 301, 303 the or each optical spectrum comprises detecting a radiometric quantity (e.g. optical intensity) for a plurality of discrete wavelengths and/or discrete frequencies.

Example 33 is a method 100, 300 in accordance with Example 32, wherein a number of wavelengths of the plurality of discrete wavelengths is greater (e.g. 120 or more) than a number of coating processes of the multiplicity of coating processes.

Example 34 is a method 100, 300 in accordance with any of Examples 1 to 33, wherein the at least one coating process has a plurality of control regions and each spectrum of the two spectra (e.g. both the first spectrum and the second spectrum) has a plurality of partial spectra, each partial spectrum of which is assigned to a control region of the at least one coating process, and wherein the at least one control parameter is changed for each control region of the at least one coating process.

Example 35 is a method 100, 300 in accordance with any of Examples 1 to 34, wherein the multiplicity of coating processes comprises more than six, seven, eight, nine, ten or more than ten, e.g. more than 15, e.g. more than 20, coating processes.

Example 36 is a method 100, 300 in accordance with any of Examples 1 to 35, wherein the correction information comprises a plurality of correction components; wherein the at least one coating process comprises a plurality of coating processes, each coating process of which is assigned to exactly one correction component of the plurality of correction components, wherein the coating process is controlled on the basis of the correction component assigned thereto.

Example 37 is a method 100, 300 in accordance with any of Examples 1 to 36, wherein the optical spectrum has a plurality of partial spectra, each partial spectrum of which correlates with a layer region of the layer stack.

Example 38 is a processor configured to carry out a method 100, 300 in accordance with any of Examples 1 to 37.

Example 39 is a non-volatile memory that stores instructions (e.g. by means of code segments, machine code, interpreter-executable code and/or source code) configured, when executed by a processor, to carry out the method 100, 300 in accordance with any of Examples 1 to 37.

Example 40 is a control device 1802, comprising: one or more than one processor 818 configured to carry out the method 100, 300 in accordance with any of Examples 1 to 37; one or more than one memory having data, wherein the data represent the model.

Example 41 is a control device 1802, comprising: a first interface 816 configured to communicate data representing one or more than one control parameter for forming 101 a layer stack by means of a multiplicity of coating processes (e.g. each coating process of which forms at least one layer of the first layer stack); a second interface 816 configured to receive data representing an optical spectrum of the layer stack; a circuit 818 configured for determining correction information for at least one coating process of the multiplicity of coating processes using a model, wherein the model provides a right-unique mapping function between a deviation of the spectrum from a desired spectrum and the correction information; and wherein the circuit is furthermore configured for changing 107 at least one control parameter for controlling the at least one coating process of the multiplicity of coating processes using the correction information; and wherein the one first interface 816 is furthermore configured to communicate the first data representing the changed control parameter, for forming 109 a second layer stack by means of the multiplicity of coating processes using the changed control parameter, each coating process of which forms at least one layer of the second layer stack.

Example 42 is a control device 1802, comprising: a first interface 816 configured to drive a multiplicity of coating processes and/or to communicate first data thereto, wherein the first data represent a multiplicity of control parameters for controlling a process of coating a substrate 112 (e.g. for forming 101 a layer stack) by means of the multiplicity of coating processes; a second interface 816 configured to receive data, wherein the second data represent an optical spectrum of the layer stack; a circuit 818, which implements a model, wherein the model provides a right-unique (e.g. linear) mapping function between a deviation of two optical spectra from one another and a change in each control parameter of the multiplicity of control parameters; wherein the circuit is furthermore configured, on the basis of the data received by means of the second interface: to determine and/or to update the mapping function; and/or to change 107 at least one control parameter using the model and to communicate data representing the changed control parameter by means of the first interface 816.

Example 43 is a coating arrangement, comprising: a multiplicity of coating devices, each coating device of which is configured to carry out at least one coating process of the multiplicity of coating processes; a sensor arrangement 714 configured to detect 103, 301, 303 an optical spectrum; and a control device 1802 in accordance with any of Examples 40 to 42, the first interface of which is communicatively coupled to the multiplicity of coating devices and the second interface of which is communicatively coupled to the sensor arrangement.

Example 44 is a coating installation 700a, 700b, comprising: one or more than one vacuum chamber 102, and the coating arrangement in accordance with Example 43, the multiplicity of coating devices of which are arranged in the one or more than one vacuum chamber 102.

Example 45 is the coating installation 700a, 700b in accordance with Example 44, wherein the sensor arrangement 714 comprises a first sensor arranged within a vacuum system formed by the one or more than one vacuum chamber 102; and/or wherein the sensor arrangement comprises a second sensor arranged outside the vacuum system.

Example 46 is the coating installation 700a, 700b in accordance with Example 44 or 45, furthermore comprising: a transport device 108 configured to transport a substrate 112 along a transport surface 111*f*, wherein the sensor arrangement comprises two sensors arranged on opposite sides of the transport surface 111*f*; and/or wherein the sensor arrangement 714 comprises two sensors arranged on the same side of the transport surface 111*f*.

Example 47 is a model 511, comprising: a first tensor, which represents an (e.g. predefined) optical desired spectrum; a second tensor, which represents an optical actual spectrum (e.g. to be detected); correction information having a plurality of components, each component of which is assigned to a coating process of a multiplicity of coating processes and represents a change to be made to a control parameter of the coating process assigned to the component;

a mapping function which maps a deviation between the first tensor and the second tensor uniquely onto the correction information (that is to say that it is right-unique).

Example 48 is the model 511 in accordance with Example 47, wherein the model comprises data representing the optical desired spectrum.

What is claimed is:

1. Method for coating, comprising:
   forming a first layer stack on a first substrate by means of a multiplicity of coating processes, each coating process of which forms at least one layer of the first layer stack;
   detecting an optical spectrum of the first layer stack;
   determining correction information for at least one coating process of the multiplicity of coating processes using a model, wherein the model comprises a right-unique mapping function that maps a deviation of the optical spectrum from a desired optical spectrum directly to the correction information; and
   changing at least one control parameter for controlling the at least one coating process of the multiplicity of coating processes using the correction information; and
   forming a second layer stack on the first or a second substrate by means of the multiplicity of coating processes using the changed control parameter, each coating process of which forms at least one layer of the second layer stack.

2. Method according to claim 1,
   wherein controlling involves using the correction information as a control difference.

3. Method according to claim 1,
   wherein the right-unique mapping function is a multivariate mapping function.

4. Method according to claim 1,
   wherein the right-unique mapping function is an n-variate mapping function; and
   wherein the deviation of the optical spectrum from the desired optical spectrum has exactly n components, each component of which is assigned to exactly one wavelength.

5. Method according to claim 1,
   wherein the correction information represents a change in an electrical power used to supply the at least one coating process.

6. Method according to claim 1,
   wherein the optical spectrum has a plurality of partial spectra which are weighted among one another and/or differently from one another.

7. Method according to claim 1,
   wherein the model maps the deviation of the optical spectrum from the desired optical spectrum uniquely onto the correction information.

8. Method according to claim 1,
   wherein the model has a linear equation system, the coefficient matrix of which is non-quadratic.

9. Method according to claim 1, furthermore comprising:
   transporting the first substrate and/or the second substrate through a plurality of coating regions, in each coating region of which exactly one or more than one coating process of the multiplicity of coating processes is carried out.

10. Method according to claim 1,
    wherein detecting the optical spectrum comprises detecting a radiometric quantity for a plurality of discrete wavelengths.

11. Method according to claim 10,
    wherein a number of wavelengths of the plurality of discrete wavelengths is greater than a number of coating processes of the multiplicity of coating processes.

12. Method according to claim 1,
    wherein the at least one coating process has a plurality of control regions and the optical spectrum has a plurality of partial spectra, each partial spectrum of which is assigned to a control region of the at least one coating process, and
    wherein, for each control region of the at least one coating process, the at least one control parameter for controlling the control region is determined on the basis of the partial spectrum assigned to the control region.

13. Method according to claim 1,
    wherein the multiplicity of coating processes comprises more than six coating processes.

14. Method according to claim 1,
    wherein the correction information comprises a plurality of correction components;
    wherein the at least one coating process comprises a plurality of coating processes, each coating process of which is assigned to exactly one correction component of the plurality of correction components.

15. Method for calibrating, comprising:
    forming a first layer stack on a first substrate by means of a multiplicity of coating processes, each coating process of which forms at least one layer of the first layer stack, wherein the following is carried out for each coating process of the multiplicity of coating processes:
    detecting a first optical spectrum of the first layer stack;
    changing at least one control parameter for controlling the coating process of the multiplicity of coating processes;
    forming a second layer stack on the first substrate or a second substrate by means of the multiplicity of coating processes using the at least one control parameter changed, each coating process of which forms at least one layer of the second layer stack;
    detecting a second optical spectrum of the second layer stack; and
    determining a model, wherein the model provides, for all coating processes of the multiplicity of coating processes, a common mapping function that maps a deviation of the second optical spectrum from the first optical spectrum directly to the change in the at least one control parameter.

16. Method according to claim 15, wherein determining the model comprises:
    determining a first mapping that maps the change onto the deviation; and
    determining a second mapping that is the inverse mapping of the first mapping, wherein the second mapping provides the mapping function.

17. Method according to claim 16, wherein determining the inverse mapping is carried out by means of a singular value decomposition.

* * * * *